US012354625B2

(12) United States Patent
Okano et al.

(10) Patent No.: US 12,354,625 B2
(45) Date of Patent: Jul. 8, 2025

(54) DISK DEVICE HAVING AN ELECTRONIC COMPONENT ON A FLEXIBLE PRINTED CIRCUIT BOARD

(71) Applicants: Kabushiki Kaisha Toshiba, Tokyo (JP); Toshiba Electronic Devices & Storage Corporation, Tokyo (JP)

(72) Inventors: Taichi Okano, Yokohama Kanagawa (JP); Kiyokazu Ishizaki, Tokyo (JP); Nobuhiro Yamamoto, Yokohama Kanagawa (JP); Kota Tokuda, Fujisawa Kanagawa (JP); Hayato Yamaguchi, Yokohama Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 18/434,091

(22) Filed: Feb. 6, 2024

(65) Prior Publication Data

US 2024/0233779 A1    Jul. 11, 2024

Related U.S. Application Data

(62) Division of application No. 17/895,905, filed on Aug. 25, 2022, now Pat. No. 11,929,103.

(30) Foreign Application Priority Data

Aug. 26, 2021  (JP) .................................. 2021-138140
Aug. 1, 2022  (JP) .................................. 2022-122931

(51) Int. Cl.
*G11B 33/12* (2006.01)
*G06F 3/06* (2006.01)
(Continued)

(52) U.S. Cl.
CPC .......... *G11B 33/122* (2013.01); *G06F 3/0676* (2013.01); *G11B 5/54* (2013.01);
(Continued)

(58) Field of Classification Search
None
See application file for complete search history.

(56) References Cited

U.S. PATENT DOCUMENTS 6,483,669 B1    11/2002 Krinke
6,498,702 B1*   12/2002 Shimizu ................. G11B 5/486
(Continued)

FOREIGN PATENT DOCUMENTS

CN         1855228 A      11/2006
CN       101563774 A      10/2009
(Continued)

OTHER PUBLICATIONS

Combined Office Action and Search Report mailed Aug. 29, 2024 in the corresponding Chinese Patent Application No. 202211012212.2 with English translation, 16 pages.

*Primary Examiner* — William J Klimowicz
(74) *Attorney, Agent, or Firm* — Kim & Stewart LLP

(57) ABSTRACT

A disk device includes a magnetic disk, a magnetic head, a flexible printed circuit board, an electronic component, and a wall. The flexible printed circuit board is electrically connected to the magnetic head. The electronic component is mounted on the flexible printed circuit board. The wall has rigidity higher than the flexible printed circuit board and is attached to the flexible printed circuit board. The flexible printed circuit board with a first through hole includes a first surface facing the electronic component with a gap, and a second surface opposite the first surface and facing the wall, the first through hole being open to the first surface and the second surface to communicate with the gap. The wall is (Continued)

provided with a second through hole penetrating the wall to communicate with the first through hole.

17 Claims, 10 Drawing Sheets

(51) Int. Cl.
*G11B 5/54* (2006.01)
*H05K 1/11* (2006.01)
*G11B 33/02* (2006.01)

(52) U.S. Cl.
CPC ............ *H05K 1/118* (2013.01); *G11B 33/022* (2013.01); *G11B 2220/2516* (2013.01)

(56) References Cited

U.S. PATENT DOCUMENTS

| | | | |
|---|---|---|---|
| 7,518,832 B2 | 4/2009 | Suzuki | |
| 10,374,345 B2 | 8/2019 | Yamamoto | |
| 10,680,368 B2 | 6/2020 | Yamamoto | |
| 10,818,316 B2 | 10/2020 | Hisakuni | |
| 2001/0005299 A1 | 6/2001 | Kado et al. | |
| 2001/0030836 A1 | 10/2001 | Katsumata | |
| 2003/0142446 A1 | 7/2003 | Habata | |
| 2006/0246748 A1 | 11/2006 | Suzuki | |
| 2008/0273262 A1 | 11/2008 | Kurita et al. | |
| 2009/0067779 A1 | 3/2009 | Furuyama | |
| 2011/0102935 A1* | 5/2011 | Nagaoka | G11B 5/486 360/245.9 |
| 2018/0337477 A1 | 11/2018 | Yamamoto | |
| 2019/0312369 A1 | 10/2019 | Yamamoto | |
| 2019/0335581 A1 | 10/2019 | Tokuda et al. | |
| 2020/0090689 A1 | 3/2020 | Hisakuni | |
| 2020/0259283 A1 | 8/2020 | Yamamoto | |

FOREIGN PATENT DOCUMENTS

| | | | |
|---|---|---|---|
| CN | 101271693 B | 2/2012 | |
| CN | 108028453 A | 5/2018 | |
| CN | 108962300 A | 12/2018 | |
| CN | 110910914 A | 3/2020 | |
| DE | 19653132 A1 * | 6/1997 | ........... G11B 5/4806 |
| DE | 69626598 T2 | 3/2004 | |
| JP | 62217476 A | 9/1987 | |
| JP | H02-092938 U | 7/1990 | |
| JP | H04-052775 U | 5/1992 | |
| JP | H07-055015 Y2 | 12/1995 | |
| JP | 2003228936 A | 8/2003 | |
| JP | 2008-010798 A | 1/2008 | |
| JP | 2014220023 A | 11/2014 | |
| KR | 20100057606 A | 5/2010 | |
| WO | 2018029920 A1 | 2/2018 | |

* cited by examiner

DISK DEVICE HAVING AN ELECTRONIC COMPONENT ON A FLEXIBLE PRINTED CIRCUIT BOARD

CROSS-REFERENCE TO RELATED APPLICATIONS

This application is a divisional application of U.S. application Ser. No. 17/895,905 filed Aug. 25, 2022 and is based upon and claims the benefit of priority from Japanese Patent Application No. 2021-138140, filed on Aug. 26, 2021 and Japanese Patent Application No. 2022-122931, filed on Aug. 1, 2022; the entire contents of which are incorporated herein by reference.

FIELD

Embodiments described herein relate generally to a disk device.

BACKGROUND

In disk devices such as a hard disk drive, information is read and written from and to a magnetic disk with a magnetic head. Such a disk device includes, for example, a flexible printed circuit board that electrically connects a controller and the magnetic head. Various electronic components are mounted on the flexible printed circuit board.

The disk device is subjected to a cleaning process to remove possible contaminants such as flux. The contaminants may, however, remain unremoved in a gap or gaps between the flexible printed circuit board and the electronic components, if there is any gap.

DESCRIPTION OF EMBODIMENTS

According to one embodiment, a disk device includes a magnetic disk, a magnetic head, a flexible printed circuit board, an electronic component, and a wall. The magnetic head is configured to read and write information from and to the magnetic disk. The flexible printed circuit board is electrically connected to the magnetic head. The electronic component is mounted on the flexible printed circuit board. The wall has rigidity higher than the flexible printed circuit board and is attached to the flexible printed circuit board. The flexible printed circuit board with a first through hole includes a first surface facing the electronic component with a gap, and a second surface opposite the first surface and facing the wall, the first through hole being open to the first surface and the second surface to communicate with the gap. The wall is provided with a second through hole penetrating the wall to communicate with the first through hole.

First Embodiment

Hereinafter, a first embodiment is described with reference to FIGS. 1 to 6. Note that, in the present specification, constituent elements according to the embodiments and descriptions of the constituent elements may be described in a plurality of expressions. The constituent elements and description thereof are examples, and are not limited by the expressions of the present specification. The constituent elements may also be identified with names different from those in the present specification. In addition, the constituent elements may be described by using an expression different from the expression of the present specification.

Figure 1:
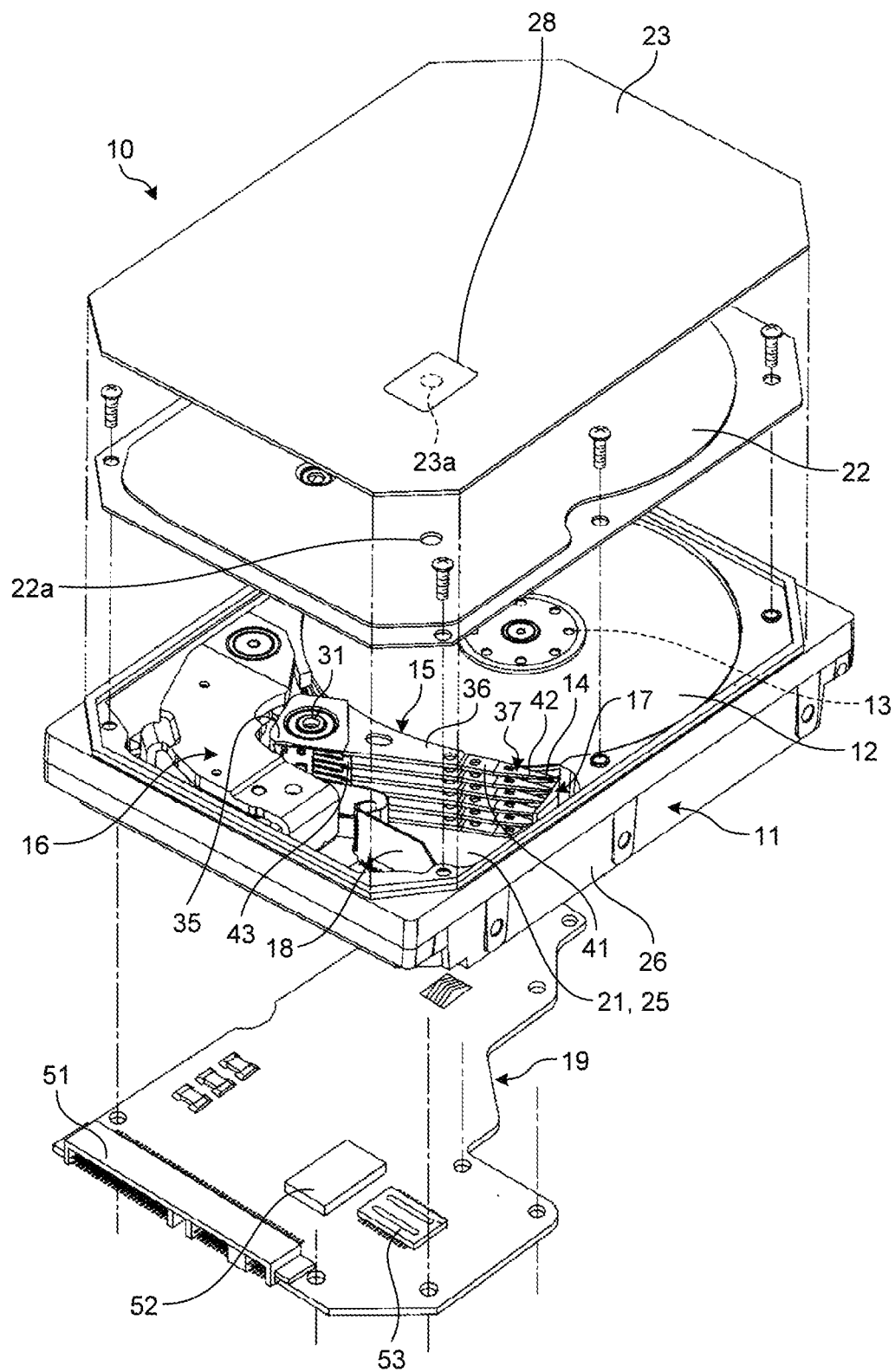
FIG. 1 is an exemplary exploded perspective view illustrating an HDD according to a first embodiment.

FIG. 1 is an exemplary exploded perspective view illustrating a hard disk drive (HDD) 10 according to the first embodiment. The HDD 10 is an example of the disk device, and may also be referred to as an electronic device, a storage device, an external storage device, or a magnetic disk device. The disk device is not limited to the HDD 10.

The HDD 10 includes a casing 11, a plurality of magnetic disks 12, a spindle motor 13, a plurality of magnetic heads 14, an actuator assembly 15, a voice coil motor (VCM) 16, a ramp load mechanism 17, a flexible printed circuit board (FPC) 18, and a printed circuit board (PCB) 19.

The casing 11 includes a base 21, an inner cover 22, and an outer cover 23. The base 21 is a bottomed container made of a metal material such as an aluminum alloy, and has a bottom wall 25 and a side wall 26. The bottom wall 25 is formed in a substantially rectangular (quadrangular) plate-like shape. The side wall 26 protrudes from an edge of the bottom wall 25. The bottom wall 25 and the side wall 26 are integrally formed.

The inner cover 22 and the outer cover 23 are made of a metal material such as an aluminum alloy, for example. The inner cover 22 is attached to an end of the side wall 26 with, for example, a screw. The outer cover 23 covers the inner cover 22 and is airtightly fixed to the end of the side wall 26 by welding, for example.

The casing 11 is sealed inside. Inside the casing 11, the magnetic disk 12, the spindle motor 13, the magnetic head 14, the actuator assembly 15, the VCM 16, the ramp load mechanism 17, and the FPC 18 are placed.

The inner cover 22 has a vent 22a. Further, the outer cover 23 has a vent 23a. After components are mounted inside the base 21 and the inner cover 22 and the outer cover 23 are attached to the base 21, air inside the casing 11 is removed through the vents 22a and 23a. Further, the casing 11 is filled with a gas different from air.

The gas filled inside the casing 11 is, for example, a low density gas having a density lower than that of air, an inert gas having low reactivity, or the like. For example, the casing 11 is filled with helium. The casing 11 may be filled with another fluid. The inside of the casing 11 may be maintained at vacuum, low pressure close to vacuum, or negative pressure lower than atmospheric pressure.

The vent 23*a* of the outer cover 23 is closed by a seal 28. The seal 28 hermetically seals the vent 23*a* to prevent the leakage of the fluid filled in the casing 11 from the vent 23*a*. Note that the inside of the casing 11 may communicate with the outside of the casing 11.

The magnetic disk 12 is, for example, a disk having magnetic recording layers provided on an upper surface and a lower surface thereof. The diameter of the magnetic disk 12 is, for example, 3.5 inches; however, the diameter is not limited to the example. The plurality of magnetic disks 12 is stacked at intervals.

The spindle motor 13 supports and rotates the magnetic disks 12 thus stacked. The magnetic disks 12 are held in a hub of the spindle motor 13 by, for example, a clamp spring.

The magnetic head 14 records and reproduces information on and from the recording layer of the magnetic disk 12. Stated differently, the magnetic head 14 reads and writes information from and to the magnetic disk 12. The magnetic head 14 is mounted on the actuator assembly 15.

The actuator assembly 15 is rotatably supported by a support shaft 31 disposed at a position spaced from the magnetic disk 12. The VCM 16 rotates the actuator assembly 15 to place the same at a desired position. When the magnetic head 14 moves to the outermost periphery of the magnetic disk 12, the ramp load mechanism 17 holds the magnetic head 14 at an unload position spaced from the magnetic disk 12.

The actuator assembly 15 includes an actuator block 35, a plurality of arms 36, and a plurality of head suspension assemblies 37. The head suspension assembly 37 is hereinafter referred to as a suspension 37. The suspension 37 may also be referred to as a head gimbal assembly (HGA).

The actuator block 35 is rotatably supported by the support shaft 31 through a bearing, for example. The plurality of arms 36 protrudes from the actuator block 35 in a direction substantially orthogonal to the support shaft 31. Another configuration is possible in which the actuator assembly 15 is divided and the arm 36 protrudes from each of the plurality of actuator blocks 35.

The plurality of arms 36 is placed at intervals in a direction in which the support shaft 31 extends. Each of the arms 36 is formed in a plate-like shape which allows the arm to enter an interval between the adjacent magnetic disks 12. The arms 36 extend substantially in parallel.

The actuator block 35 and the arms 36 are integrally made of, for example, aluminum. Note that the material of the actuator block 35 and the arms 36 is not limited to the example.

A voice coil of the VCM 16 is provided on a protrusion protruding from the actuator block 35 to the other side of the arm 36. The VCM 16 includes a pair of yokes, the voice coil disposed between the yokes, and a magnet provided on the yoke.

The VCM 16 rotates the actuator assembly 15 as described above. In other words, the VCM 16 rotates (moves) the actuator block 35, the arm 36, and the suspension 37 together.

The suspension 37 is attached to an end of the corresponding arm 36 and protrudes from the arm 36. Thereby, the plurality of suspensions 37 is placed at intervals in the direction in which the support shaft 31 extends.

Each of the suspensions 37 includes a base plate 41, a load beam 42, and a flexure 43. Further, the magnetic head 14 is mounted on a tip of the suspension 37.

The base plate 41 and the load beam 42 are made of, for example, stainless steel. Note that the materials of the base plate 41 and the load beam 42 are not limited to the example. The base plate 41 is formed in a plate-like shape and is attached to the end of the arm 36. The load beam 42 is formed in a plate-like shape thinner than the base plate 41. The load beam 42 is attached to an end of the base plate 41 and protrudes from the base plate 41.

The flexure 43 is formed in an elongated belt shape. Note that the shape of the flexure 43 is not limited to the example. The flexure 43 is a stacked plate including a metal plate (backing layer) made of stainless steel or the like, an insulating layer formed on the metal plate, a conductive layer formed on the insulating layer and constituting a plurality of wirings (wiring patterns), and a protective layer (insulating layer) covering the conductive layer.

A gimbal part (elastic support part) that is positioned on the load beam 42 and is displaceable is provided in one end of the flexure 43. The gimbal part is provided in the tip of the suspension 37 and the magnetic head 14 is mounted on the gimbal part. The other end of the flexure 43 is connected to the FPC 18. This allows the FPC 18 to be electrically connected to the magnetic head 14 through the wiring of the flexure 43.

The PCB 19 is, for example, a rigid board such as a glass epoxy board, and is a multilayer board, a build-up board, or the like. The PCB 19 is provided external to the casing 11 and is attached to the bottom wall 25 of the base 21. The PCB 19 is attached to the bottom wall 25 with, for example, a plurality of screws.

For example, an interface (I/F) connector 51, a controller 52, and a relay connector 53 are mounted on the PCB 19. Other components may be mounted on the PCB 19.

The I/F connector 51 is a connector conforming to an interface standard such as serial ATA (SATA), and is connected to an I/F connector of a host computer. The HDD 10 receives power supply from the host computer through the I/F connector 51, and sends and receives various pieces of data to and from the host computer.

The controller 52 is, for example, a system-on-chip (SoC), and includes a read/write channel (RWC), a hard disk controller (HDC), and a processor. Note that the RWC, the HDC, and the processor may be separate components.

The processor of the controller 52 is, for example, a central processing unit (CPU). The processor performs overall control of the HDD 10 according to firmware stored in advance in the ROM, for example. For example, the processor loads the firmware of the ROM into the RAM, and controls the magnetic head 14, the RWC, the HDC, and other parts according to the firmware thus loaded.

The relay connector 53 is electrically connected to various components placed inside the casing 11, for example, through a connector provided on the bottom wall 25. This allows the PCB 19 to be electrically connected to the spindle motor 13, the magnetic head 14, the actuator assembly 15, the VCM 16, and the FPC 18 placed inside the casing 11.

Figure 2:
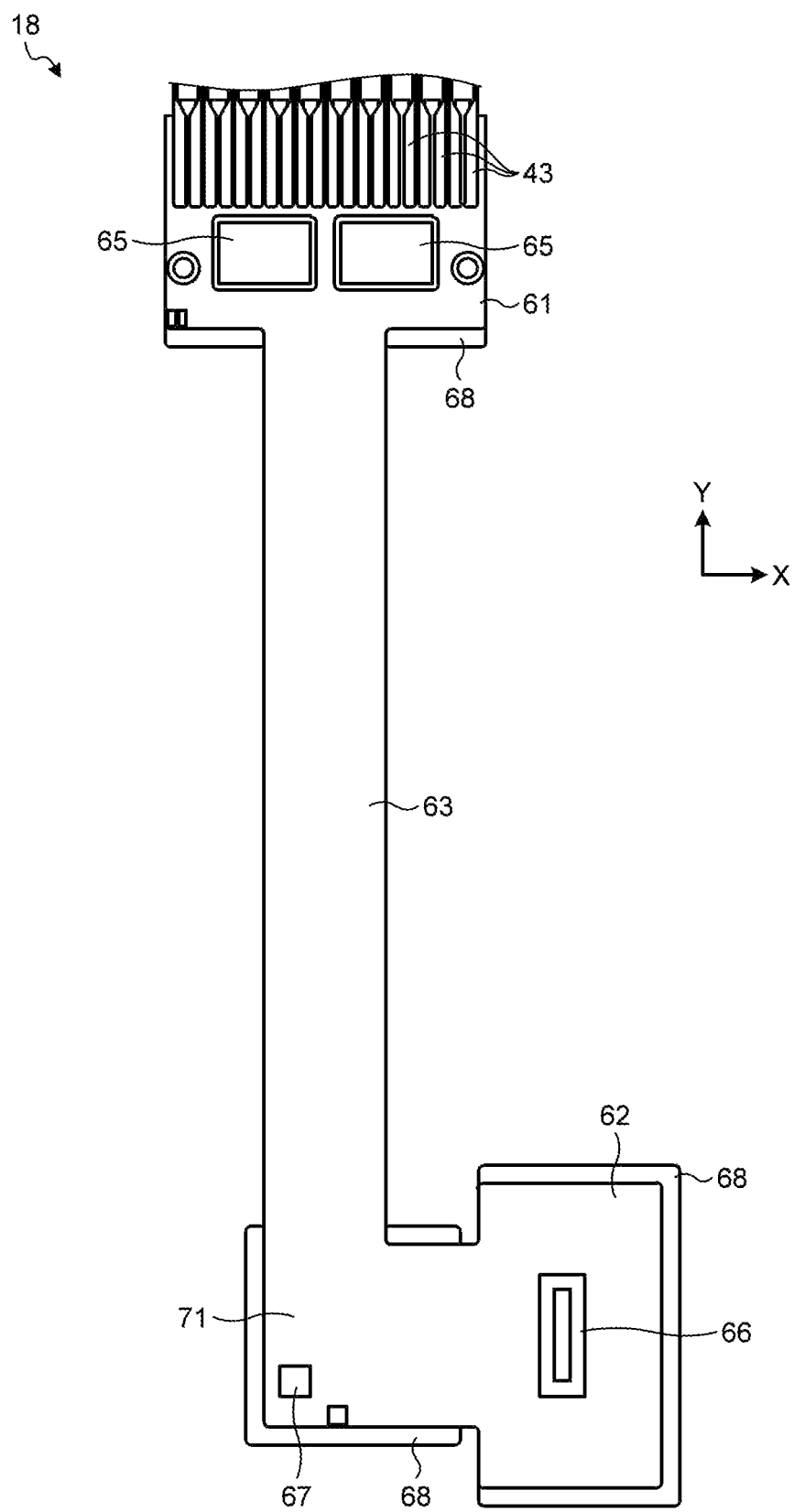
FIG. 2 is an exemplary plan view schematically illustrating an FPC of the first embodiment.

FIG. 2 is an exemplary plan view schematically illustrating the FPC 18 of the first embodiment. As illustrated in FIG. 2, the FPC 18 is formed in a substantially L-shaped belt shape in a natural state where the FPC 18 is detached from the other components and no external force acts. Note that the shape of the FPC 18 is not limited to the example. The FPC 18 includes a first connection part 61, a second connection part 62, and an intermediate part 63.

The first connection part 61 is provided, for example, in one end of the FPC 18 in a direction in which the FPC 18 extends. The first connection part 61 is attached to the actuator block 35 with, for example, a screw. The first connection part 61 is electrically connected to the VCM 16 and the flexure 43.

The second connection part 62 is provided, for example, in the other end of the FPC 18 in the direction in which the FPC 18 extends. The second connection part 62 is attached to the bottom wall 25 with, for example, a screw. The second connection part 62 is electrically connected to the PCB 19 through, for example, a connector provided on the bottom wall 25.

The intermediate part 63 is provided between the first connection part 61 and the second connection part 62. The intermediate part 63 extends in a belt shape and bends between the first connection part 61 and the second connection part 62 in accordance with rotation of the actuator block 35.

As illustrated in the drawings, in the present specification, an X-axis, a Y-axis, and a Z-axis are defined for convenience. The X-axis, the Y-axis, and the Z-axis are orthogonal to one another. The X-axis is along the width of the intermediate part 63 in the natural state. The Y-axis is along the length of the intermediate part 63 in the natural state. The Z-axis is along the thickness of the FPC 18 in the natural state.

Further, in the present specification, an X-direction, a Y-direction, and a Z-direction are defined. The X-direction is a direction along the X-axis and includes a +X-direction indicated by an arrow of the X-axis and a −X-direction which is an opposite direction of the arrow of the X-axis. The Y-direction is a direction along the Y-axis and includes a +Y-direction indicated by an arrow of the Y-axis and a −Y-direction which is an opposite direction of the arrow of the Y-axis. The Z-direction is a direction along the Z-axis and includes a +Z-direction indicated by an arrow of the Z-axis and a −Z-direction which is an opposite direction of the arrow of the Z-axis.

The first connection part 61 is connected to an end of the intermediate part 63 in the +Y-direction and extends in the +Y-direction from the end. The second connection part 62 is connected to an end of the intermediate part 63 in the −Y-direction and extends in the +X-direction from the end. Note that the first connection part 61 and the second connection part 62 are not limited to the example.

The HDD 10 further includes a plurality of preamplifiers 65, a relay connector 66, a sensor 67, and a plurality of reinforcing plates 68. The relay connector 66 and the sensor 67 are examples of the electronic component. The reinforcing plate 68 is an example of a wall.

The preamplifier 65 is mounted on the first connection part 61. The preamplifier 65 is electrically connected to the flexure 43, for example, through a wiring and pads of the FPC 18. In addition, the preamplifier 65 is electrically connected to the magnetic head 14 through the flexure 43. The preamplifier 65 amplifies a write signal to send the write signal to the magnetic head 14, and amplifies a read signal sent from the magnetic head 14.

The relay connector 66 and the sensor 67 are mounted on the second connection part 62. The relay connector 66 is electrically connected to the relay connector 53 of the PCB 19, for example, through a connector provided on the bottom wall 25. The second connection part 62 is thereby connected to the PCB 19. The relay connector 66 may be directly connected to the relay connector 53 of the PCB 19. The sensor 67 detects, for example, humidity or atmospheric pressure inside the casing 11. Note that the sensor 67 is not limited to the example.

The reinforcing plate 68 is made of, for example, a metal such as aluminum or a synthetic resin, and is formed in a plate-like shape. Note that the reinforcing plate 68 is not limited to the example. The reinforcing plates 68 are attached to the first connection part 61 and the second connection part 62.

The reinforcing plate 68 has rigidity higher than that of the FPC 18. The reinforcing plate 68 thus improves rigidity of the first connection part 61 and the second connection part 62. The intermediate part 63 is not attached to the reinforcing plate 68 and can be bent.

Figure 3:
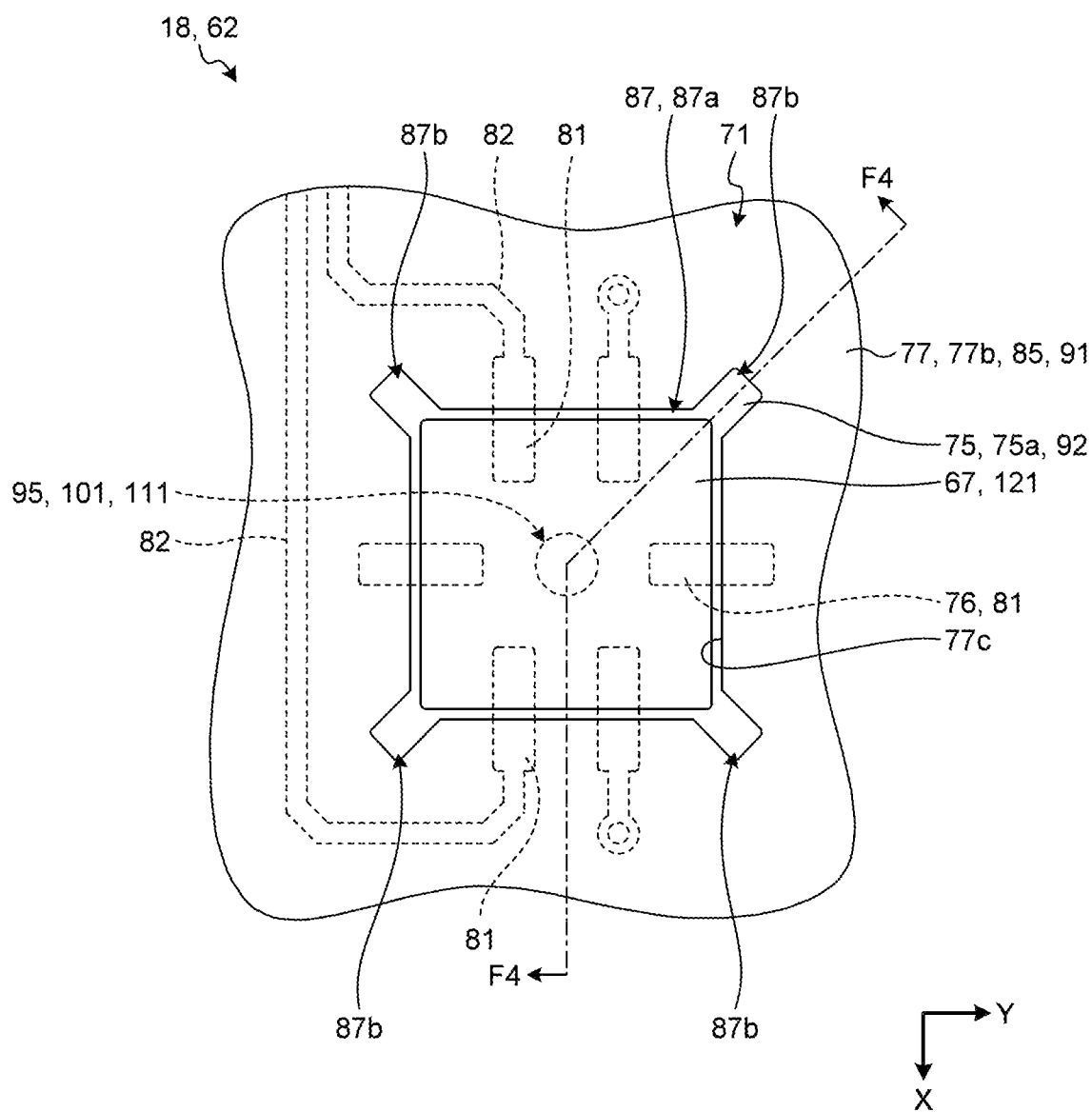
FIG. 3 is an exemplary plan view illustrating a part of a second connection part in the vicinity of a sensor of the first embodiment.
Figure 4:
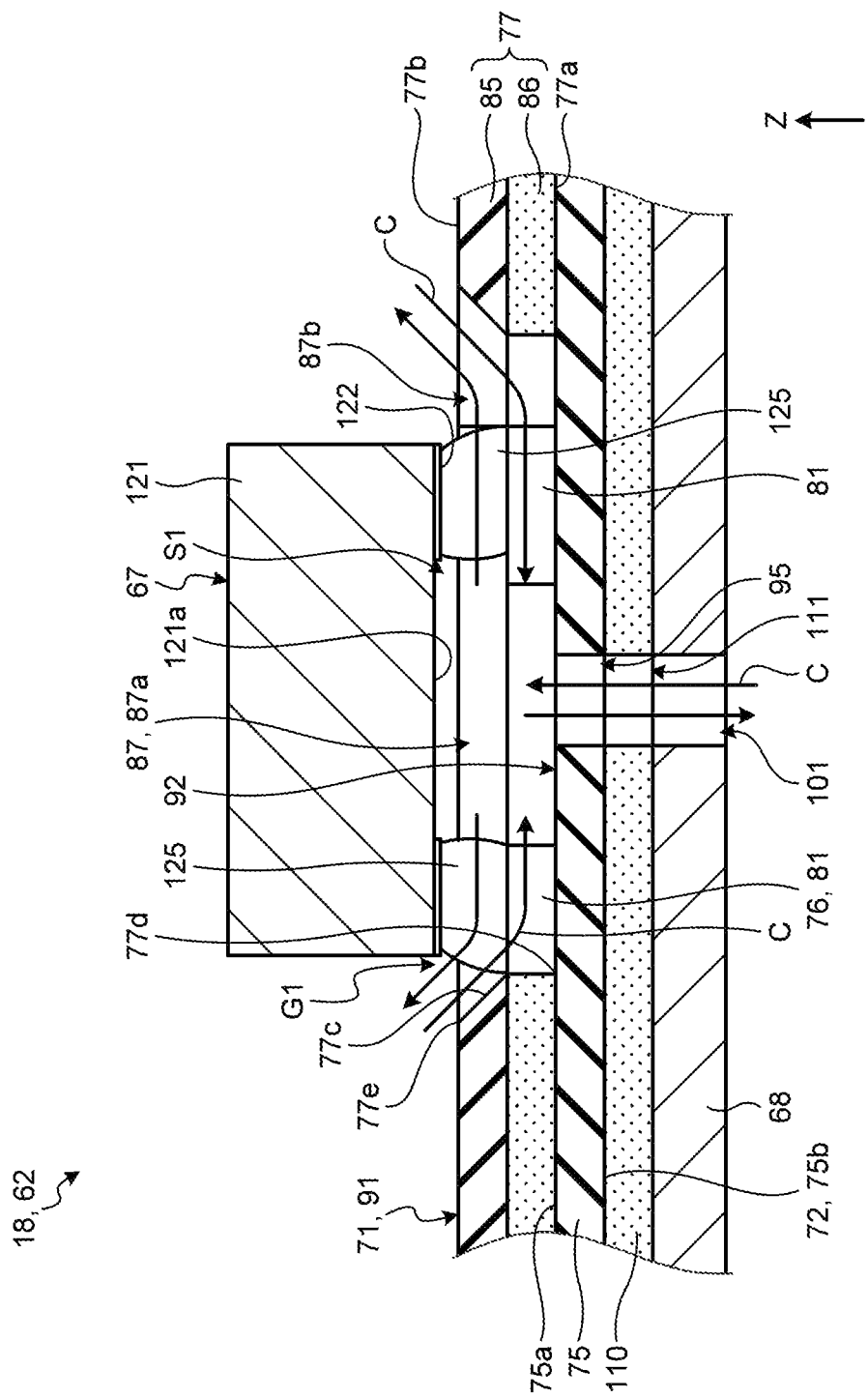
FIG. 4 is an exemplary cross-sectional view illustrating a part of the second connection part of the first embodiment taken along the line F4-F4 of FIG. 3.

FIG. 3 is an exemplary plan view illustrating a part of the second connection part 62 in the vicinity of the sensor 67 of the first embodiment. FIG. 4 is an exemplary cross-sectional view illustrating a part of the second connection part 62 of the first embodiment taken along the line F4-F4 of FIG. 3.

As illustrated in FIG. 4, the FPC 18 has a mounting surface 71 and a back surface 72. The back surface 72 is an example of the second surface. The mounting surface 71 is one surface of the FPC 18. The preamplifier 65, the relay connector 66, and the sensor 67 are mounted on the mounting surface 71. The mounting surface 71 thus faces the preamplifier 65, the relay connector 66, and the sensor 67. The back surface 72 is located on the opposite side of the mounting surface 71. The back surface 72 faces the reinforcing plate 68.

The FPC 18 includes a base layer 75, a conductive layer 76, and a cover layer 77. The base layer 75 is an example of a first layer. The conductive layer 76 is an example of a third layer. The cover layer 77 is an example of a second layer.

The base layer 75 is made of, for example, an insulating material such as polyimide, and has insulation property. In a case where the FPC 18 is a multilayer FPC, the base layer 75 may have a plurality of insulating layers and a plurality of conductive layers.

The base layer 75 has an upper surface 75a and a lower surface 75b. Note that "upper" and "lower" in the present specification are convenient expressions on the basis of the vertical direction in FIG. 4, and are not intended to limit the direction, position, and other conditions. The upper surface 75a is an example of the first surface. The lower surface 75b is an example of the second surface.

The upper surface 75a is a surface of the base layer 75 facing the +Z-direction. The lower surface 75b is located on the opposite side of the upper surface 75a and is a surface of the base layer 75 facing the −Z-direction. The back surface 72 of the FPC 18 includes the lower surface 75b.

The conductive layer 76 is made of, for example, a conductor such as copper and has conductive property. The conductive layer 76 is provided on the upper surface 75a of the base layer 75. An adhesive layer may be provided between the conductive layer 76 and the upper surface 75a.

As illustrated in FIG. 3, the conductive layer 76 includes a plurality of pads 81 and a plurality of wirings 82. The pad 81 is an example of a first terminal and may also be referred to as a land or an electrode. The pad 81 and the wiring 82 are provided on the upper surface 75a of the base layer 75.

The sensor 67 is electrically connected to the pad 81. The wiring 82 extends from the pad 81 and electrically connects, for example, the pad 81 and the relay connector 66. Note that the wiring 82 may be connected to another wiring, a via hole, a ground, or another conductor.

The cover layer 77 covers at least a part of the upper surface 75a of the base layer 75 and at least a part of the conductive layer 76. Thus, the conductive layer 76 is located between the base layer 75 and the cover layer 77. For example, the cover layer 77 covers a part of the pad 81 and the wiring 82. As illustrated in FIG. 4, the cover layer 77 has a lower surface 77*a* and an upper surface 77*b*. The upper surface 77*b* is an example of a third surface.

The lower surface 77*a* is a surface of the cover layer 77 facing the −Z-direction. The lower surface 77*a* faces the upper surface 75*a* of the base layer 75. The upper surface 77*b* is located on the opposite side of the lower surface 77*a* and is a surface of the cover layer 77 facing the +Z-direction. The upper surface 77*b* forms a surface of the FPC 18. Therefore, the mounting surface 71 of the FPC 18 includes the upper surface 77*b* of the cover layer 77.

The cover layer 77 includes a cover film 85 and an adhesive 86. The cover film 85 is made of, for example, an insulating material such as polyimide. The adhesive 86 is made of, for example, an insulating adhesive. The cover layer 77 thus has insulation property. In other words, the electrical resistance of each of the base layer 75 and the cover layer 77 is higher than the electrical resistance of the conductive layer 76.

The adhesive 86 is interposed between the cover film 85, the upper surface 75*a* of the base layer 75, and the conductive layer 76. The adhesive 86 adheres the cover film 85 to the upper surface 75*a* of the base layer 75 and the conductive layer 76.

The cover layer 77 has an exposure hole 87. The exposure hole 87 is an example of a third through hole and an exposure hole. The exposure hole 87 penetrates the cover layer 77 in the substantially Z-direction and is open to the lower surface 77*a* and the upper surface 77*b*. As illustrated in FIG. 3, the exposure hole 87 includes an exposure part 87*a* and a plurality of extending parts 87*b*.

The exposure part 87*a* has a shape corresponding to the shape of the sensor 67. In this embodiment, the exposure part 87*a* is a substantially rectangular hole. The exposure part 87*a* exposes a part of the upper surface 75*a* of the base layer 75 and a part of the plurality of pads 81. The exposed upper surface 75*a* thus forms the surface of the FPC 18 and is included in the mounting surface 71 of the FPC 18.

The plurality of extending parts 87*b* extend from the exposure part 87*a*, for example, radially. The extending part 87*b* exposes a part of the upper surface 75*a* of the base layer 75. On the other hand, the extending part 87*b* is spaced from the conductive layer 76. That is, the conductive layer 76 is not exposed by the extending part 87*b*.

As illustrated in FIG. 4, the cover layer 77 further has an inner surface 77*c* that is an inner surface of the exposure hole 87. The inner surface 77*c* extends between the lower surface 77*a* and the upper surface 77*b* of the cover layer 77. Since the lower surface 77*a* is adhered to the upper surface 75*a* of the base layer 75, the inner surface 77*c* extends between the upper surface 75*a* of the base layer 75 and the upper surface 77*b* of the cover layer 77.

The inner surface 77*c* has a first edge 77*d* and a second edge 77*e*. The first edge 77*d* is an edge of the inner surface 77*c* connected to the lower surface 77*a*. The first edge 77*d* is also an edge of the lower surface 77*a* connected to the inner surface 77*c*. Since the lower surface 77*a* is adhered to the upper surface 75*a* of the base layer 75, the first edge 77*d* is connected to the upper surface 75*a* of the base layer 75. The second edge 77*e* is an edge of the inner surface 77*c* connected to the upper surface 77*b*. The second edge 77*e* is also an edge of the upper surface 77*b* connected to the inner surface 77*c*.

At least a part of the exposure hole 87 is tapered toward the upper surface 75*a* of the base layer 75. The second edge 77*e* is thus larger than the first edge 77*d*. At least a part of the inner surface 77*c* extends, for example, diagonally with respect to the upper surface 75*a* of the base layer 75 between the first edge 77*d* and the second edge 77*e*. A part of the inner surface 77*c* may extend so as to be substantially vertical to the upper surface 75*a*.

The exposure hole 87 is formed, for example, by punching the cover film 85. The shape of the inner surface 77*c* can be easily controlled by punching. Therefore, the exposure hole 87 extending diagonally with respect to the upper surface 75*a* can be easily formed.

In the FPC 18 described above, the mounting surface 71 has a surface region 91 and a recessed region 92. The surface region 91 is an example of a first region. The recessed region 92 is an example of a second region. In the example of FIGS. 3 and 4, the surface region 91 has the upper surface 77*b* of the cover layer 77. The exposure hole 87 is thus open to the surface region 91.

The recessed region 92 is recessed from the surface region 91. In the example of FIGS. 3 and 4, the recessed region 92 has the upper surface 75*a* of the base layer 75 exposed by the exposure hole 87 and the inner surface 77*c* of the cover layer 77. The pad 81 is thus provided on the recessed region 92. The second edge 77*e* of the inner surface 77*c* is also an edge of the surface region 91 connected to the inner surface 77*c* of the recessed region 92.

The FPC 18 has a through hole 95. The through hole 95 is an example of the first through hole. The through hole 95 penetrates the base layer 75 in the substantially Z-direction and is open to the upper surface 75*a* and the lower surface 75*b*. In the example of FIG. 3, the through hole 95 has a circular cross section. The shape of the cross section of the through hole 95 is not limited to the example, and may be a quadrangle or another shape.

As illustrated in FIG. 4, the through hole 95 is provided in a portion of the upper surface 75*a* exposed by the exposure hole 87. The through hole 95 is thus exposed by the exposure hole 87 and provided in the recessed region 92. In other words, the through hole 95 communicates with the exposure hole 87.

The reinforcing plate 68 is attached to the FPC 18 so as to cover the lower surface 75*b* of the base layer 75. Thus, the base layer 75 is located between the cover layer 77 and the reinforcing plate 68. The reinforcing plate 68 has a through hole 101. The through hole 101 is an example of the second through hole.

The through hole 101 penetrates the reinforcing plate 68 in the substantially Z-direction. The through hole 101 has substantially the same shape as the through hole 95 of the FPC 18. The through hole 101 overlaps the through hole 95 in the Z-direction and communicates with the through hole 95. The shape of the through hole 101 may be different from the shape of the through hole 95.

An adhesive layer 110 is provided between the FPC 18 and the reinforcing plate 68. The adhesive layer 110 adheres the FPC 18 and the reinforcing plate 68 to each other. The adhesive layer 110 has a through hole 111. The through hole 111 has substantially the same shape as the through holes 95 and 101, and allows the through hole 95 and the through hole 101 to communicate with each other.

The sensor 67 is, for example, a land grid array (LGA). Note that the sensor 67 is not limited to the example. The sensor 67 includes a package 121 and a plurality of lands 122. The package 121 is an example of a case. The land 122 is an example of a second terminal.

The package 121 includes, for example, a circuit board on which a plurality of elements is mounted, and a mold resin that covers the circuit board and the elements. The case is a member that forms an outer surface of the electronic component, and may also serve as a component on which an electric circuit such as the circuit board is provided.

The package 121 has a lower surface 121a. The lower surface 121a faces the upper surface 75a of the base layer 75 exposed to the exposure hole 87 through a space S1. In other words, the upper surface 75a of the base layer 75 faces the package 121 of the sensor 67 through the space S1. The space S1 is an example of the gap.

The land 122 is provided on the lower surface 121a of the package 121. The land 122 is electrically connected to the pad 81 of the FPC 18 through solder 125. The sensor 67 is thus mounted on the recessed region 92 of the mounting surface 71 of the FPC 18.

The through hole 95 of the FPC 18 communicates with the space S1 provided between the upper surface 75a of the base layer 75 and the package 121. In a direction along the upper surface 75a (X-Y plane), the through hole 95 communicates with the space S1 at substantially the center of the space S1. Note that the position of the through hole 95 is not limited to the example. The space S1 communicates with the outside of the FPC 18 through the through holes 95, 101, and 111.

In the direction along the upper surface 75a, each of the through holes 95, 101, and 111 is smaller than the exposure hole 87. Further, in the direction along the upper surface 75a, each of the through holes 95, 101, and 111 is smaller than the package 121.

In the direction along the upper surface 75a, an edge (second edge 77e) of the upper surface 77b connected to the inner surface 77c is larger than the package 121 of the sensor 67. In the direction along the upper surface 75a, the package 121 is located inside the second edge 77e.

In the direction along the upper surface 75a, the second edge 77e is spaced from the package 121. In other words, in a direction along the surface region 91, an edge (second edge 77e) of the surface region 91 connected to the inner surface 77c of the recessed region 92 is spaced from the package 121. In the direction along the upper surface 75a, the first edge 77d is also spaced from the package 121.

A gap G1 is provided between the package 121 and the second edge 77e. The gap G1 communicates with the space S1 and the outside of the FPC 18. Stated differently, the space S1 communicates with the outside of the FPC 18 through the gap G1.

In the direction along the upper surface 75a, at least a part of the extending part 87b of the exposure hole 87 is spaced from the package 121. The extending part 87b thus communicates with the space S1 and the outside of the FPC 18. Stated differently, the space S1 communicates with the outside of the FPC 18 through the extending part 87b.

Figure 5:
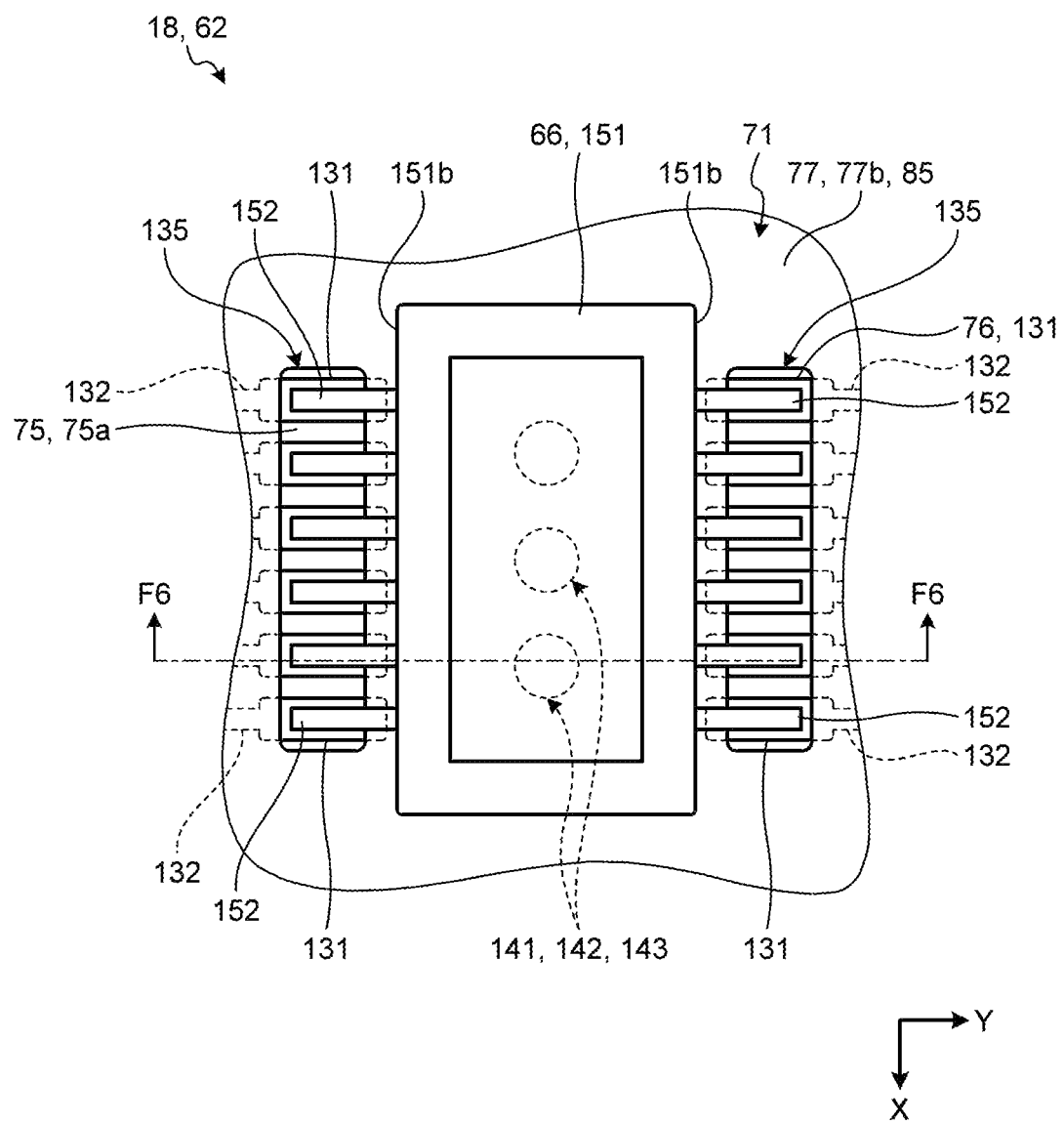
FIG. 5 is an exemplary plan view illustrating a part of the second connection part in the vicinity of a relay connector of the first embodiment.
Figure 6:
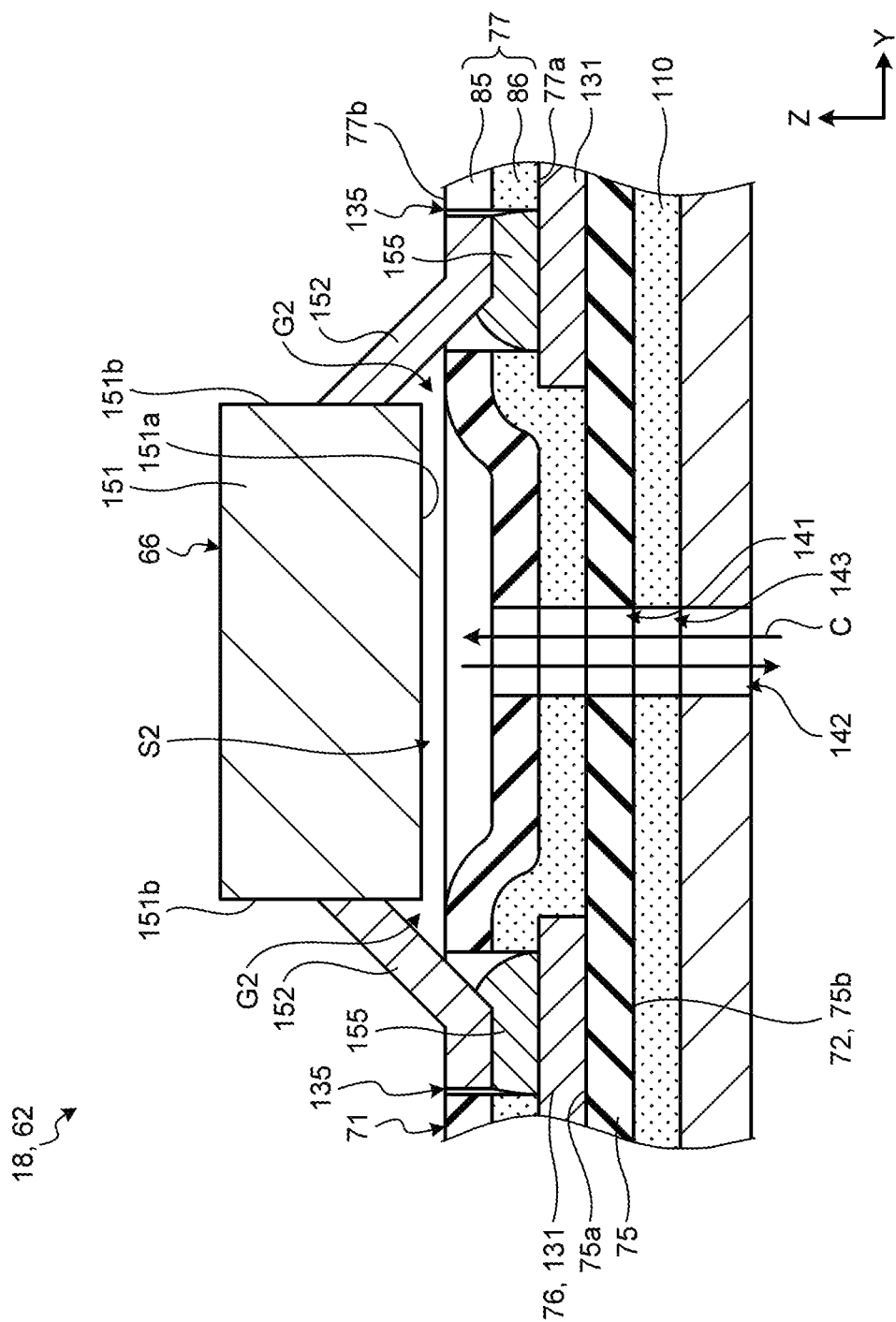
FIG. 6 is an exemplary cross-sectional view illustrating a part of the second connection part of the first embodiment taken along the line F6-F6 of FIG. 5.

FIG. 5 is an exemplary plan view illustrating a part of the second connection part 62 in the vicinity of the relay connector 66 of the first embodiment. FIG. 6 is an exemplary cross-sectional view illustrating a part of the second connection part 62 of the first embodiment taken along the line F6-F6 of FIG. 5.

As illustrated in FIG. 5, the conductive layer 76 includes a plurality of pads 131 and a plurality of wirings 132. The pad 131 is an example of the first terminal and may also be referred to as a land or an electrode. The pad 131 and the wiring 132 are provided on the upper surface 75a of the base layer 75.

The relay connector 66 is electrically connected to the pad 131. The wiring 132 extends from the pad 131 and electrically connects, for example, the pad 131 and the preamplifier 65 or the sensor 67. Note that the wiring 132 may be connected to another wiring, a via hole, a ground, or another conductor.

The cover layer 77 covers a part of the pad 131 and the wiring 132. The cover layer 77 has a plurality of exposure holes 135. As illustrated in FIG. 6, the exposure hole 135 penetrates the cover layer 77 in the substantially Z-direction and is open to the lower surface 77a and the upper surface 77b. The exposure hole 135 exposes a part of the upper surface 75a of the base layer 75 and a part of the plurality of pads 131.

The FPC 18 has a plurality of through holes 141. The through hole 141 is an example of the first through hole. Each of the through holes 141 penetrates the base layer 75 and the cover layer 77 in the substantially Z-direction and is open to the upper surface 77b of the mounting surface 71 and the lower surface 75b of the back surface 72.

In the example of FIG. 5, the through hole 141 has a circular cross section. The shape of the cross section of the through hole 141 is not limited to the example, and may be a quadrangle or another shape. The shapes of the plurality of through holes 141 may be different from each other.

As illustrated in FIG. 6, a plurality of through holes 142 is provided in the reinforcing plate 68. The through hole 142 is an example of the second through hole. The through hole 142 penetrates the reinforcing plate 68 in the substantially Z-direction. The through hole 142 has substantially the same shape as the through hole 141 of the FPC 18. The through hole 142 overlaps the through hole 141 in the Z-direction and communicates with the through hole 141. The shape of the through hole 142 may be different from the shape of the through hole 141.

The adhesive layer 110 has a plurality of through holes 143. The through hole 143 has substantially the same shape as the through holes 141 and 142, and allows the through hole 141 and the through hole 142 to communicate with each other. The shape of the through hole 143 may be different from the shape of the through holes 141 and 142.

The relay connector 66 includes a case 151 and a plurality of lead wires 152. The lead wire 152 is an example of the second terminal. For example, the case 151 is a portion, of the relay connector 66, formed of an insulator such as a synthetic resin. A conductor including the lead wire 152 is attached to the case 151.

The case 151 has a lower surface 151a and a side surface 151b. The lower surface 151a faces the upper surface 77b of the cover layer 77 through the space S2. In other words, the upper surface 77b of the cover layer 77 faces the case 151 of the relay connector 66 through the space S2. The space S2 is an example of the gap. The side surface 151b faces a direction intersecting a direction in which the lower surface 151a faces.

The lead wire 152 is provided on the side surface 151b of the case 151. The lead wire 152 is electrically connected to the pad 131 of the FPC 18 through solder 155. The relay connector 66 is thus mounted on the FPC 18. The through hole 141 of the FPC 18 communicates with the space S2 provided between the upper surface 77b of the cover layer 77 and the case 151. In a direction along the upper surface 77b (X-Y plane), one of the through holes 141 communicates with the space S2 at substantially the center of the space S2. Note that the position of the through hole 141 is not limited to the example. The space S2 communicates with the outside of the FPC 18 through the through holes 141, 142, and 143.

Hereinafter, a method for mounting the relay connector 66 and the sensor 67 on the FPC 18 is partly exemplified. The method for mounting the relay connector 66 and the sensor 67 on the FPC 18 is not limited to the following method, and other methods may be used. First, solder paste (solder 125 and 155) is supplied to the pads 81 and 131 by, for example, printing or coating.

Next, the sensor 67 is mounted on the pad 81. Further, the relay connector 66 is mounted on the pad 131. The FPC 18 is located between the sensor 67 and the reinforcing plate 68 and between the relay connector 66 and the reinforcing plate 68. Therefore, the reinforcing plate 68 can prevent the FPC 18 from deforming at the time of mounting.

Next, the FPC 18 is heated in a reflow furnace, so that the solder paste is melted. This allows the land 122 of the sensor 67 to be bonded to the pad 81, and the lead wire 152 of the relay connector 66 to be bonded to the pad 131. At this time, flux mixed with or separately supplied to the solder 125 and 155 may flow out of the solder 125 and 155.

Next, the FPC 18 is cleaned by, for example, ultrasonic cleaning. For example, the FPC 18 is placed in a tank filled with cleaning liquid C. As indicated by arrows in FIG. 4, the cleaning liquid C flows into the space S1 through the through holes 95, 101, and 111. Further, the cleaning liquid C can be discharged from the space S1 to the outside of the FPC 18 through the through holes 95, 101, and 111.

The cleaning liquid C flows into the space S1 through the gap G1. The cleaning liquid C also flows into the space S1 through the extending part 87*b* of the exposure hole 87. The cleaning liquid C can be discharged from the space S1 to the outside of the FPC 18 through the gap G1 and the extending part 87*b*.

The cleaning liquid C flows into the space S1 and is discharged from the space S1. That is, the cleaning liquid C flows through the space S1. As a result, the cleaning liquid C can remove a substance that may contaminate the HDD 10, such as the flux, from the space S1.

As illustrated in FIG. 6, the cleaning liquid C flows into the space S2 through the through holes 141, 142, and 143. Further, the cleaning liquid C can be discharged from the space S2 to the outside of the FPC 18 through the through holes 141, 142, and 143. The cleaning liquid C can also pass through a gap G2 between the case 151 and the FPC 18.

The cleaning liquid C flows into the space S2 and is discharged from the space S2. That is, the cleaning liquid C flows through the space S2. As a result, the cleaning liquid C can remove a substance that is present in the space S2 and may contaminate the HDD 10.

When the ultrasonic cleaning is completed, the FPC 18 is taken out from the cleaning liquid C. At this time, the cleaning liquid C in the space S1 is discharged through at least one of the through holes 95, 101, and 111, the gap G1, and the extending part 87*b*. The cleaning liquid C in the space S2 is discharged through at least one of the through holes 141, 142, and 143 and the gap G2.

For example, the cleaning liquid C flowing into the spaces S1 and S2 transmits ultrasonic waves. The ultrasonic waves float the flux present in the spaces S1 and S2 from the FPC 18. The cleaning liquid C is then discharged from the spaces S1 and S2 together with the flux as described above. Thus, the mounting of the component on the FPC 18 is completed.

In the HDD 10 according to the first embodiment described above, the FPC 18 has the upper surface 75*a* facing the sensor 67 through the space S1, and the lower surface 75*b* opposite the upper surface 75*a* and facing the reinforcing plate 68. The FPC 18 is provided with the through hole 95 that is open to the upper surface 75*a* and the lower surface 75*b* to communicate with the space S1. The reinforcing plate 68 is provided with the through hole 101 penetrating the reinforcing plate 68 to communicate with the through hole 95. That is, the space S1 between the sensor 67 and the upper surface 75*a* communicates with the outside through the through holes 95 and 101. As a result, the cleaning liquid C flows through the through holes 95 and 101 to be able to clean the space S1 so as not to allow possible contaminants to the HDD 10 as the flux to remain in the space S1. The HDD 10 of this embodiment can be thus kept away from contaminants. Consequently, the HDD 10 can be avoided from having a failure such as a head crash, which may otherwise be caused by contaminants.

The FPC 18 includes the pad 81. The sensor 67 includes the package 121 provided with the land 122. The land is electrically connected to the pad 81 through the solder 125. The space S1 lies between the upper surface 75*a* and the package 121. That is, the cleaning liquid C can be introduced into the large space S1 between the package 121 and the upper surface 75*a* through the through holes 95 and 101. In the HDD 10 of this embodiment, thus, the large space S1 between the package 121 and the upper surface 75*a*, in which possible contaminants to the HDD 10 are likely to remain, can be easily cleaned with the cleaning liquid C.

The FPC 18 includes the base layer 75 having the upper surface 75*a* and the cover layer 77 covering the upper surface 75*a*. The cover layer 77 is provided with the exposure hole 87 penetrating the cover layer 77 to expose the upper surface 75*a*, the through hole 95, and the pad 81. The cover layer 77 has the upper surface 77*b* to which the exposure hole 87 is open, and the inner surface 77*c* of the exposure hole 87 extending between the upper surface 75*a* and the upper surface 77*b*. In the direction along the upper surface 75*a*, the edge (second edge 77*e*) of the upper surface 77*b* connected to the inner surface 77*c* is apart from the package 121. This creates the gap G1 between the second edge 77*e* and the package 121 in communication with the space S1. The gap G1 allows the cleaning liquid C to flow therethrough to be able to clean the space S1 so as not to allow possible contaminants to the HDD 10 as the flux to remain in the space S1. Further, the space S1 is in communication with the outside through two or more paths, therefore, the cleaning liquid C can smoothly flow therein without stagnation.

The inner surface 77*c* has the first edge 77*d* connected to the upper surface 75*a* and the second edge 77*e* connected to the upper surface 77*b*. The second edge 77*e* is larger than the first edge 77*d*. At least a part of the inner surface 77*c* extends diagonally with respect to the upper surface 75*a* between the first edge 77*d* and the second edge 77*e*. The cover layer 77 having such an inner surface can create a wider gap G1 and cover a wider range of the upper surface 75*a* than that having an inner surface 77*c* extending perpendicular to the upper surface 75*a*. Thus, in the HDD 10 of this embodiment, the cover layer 77 can prevent the conductive layer 76 overlaying the upper surface 75*a* from being widely exposed and corroded.

The FPC 18 includes the base layer 75, the cover layer 77, and the conductive layer 76. The conductive layer 76 lies between the base layer 75 and the cover layer 77 and includes the pad 81. The cover layer 77 is provided with the exposure hole 87 penetrating the cover layer 77. The exposure hole 87 includes the exposure part 87*a* that exposes the upper surface 75*a*, the through hole 95, and the pad 81, and the extending part 87*b* that extends from the exposure part 87*a* to expose the upper surface 75*a*. The extending part 87*b* is apart from the conductive layer 76. In the direction along the upper surface 75*a*, at least a part of the extending part 87*b* is apart from the package 121. The extending part 87*b* thus allows the space S1 to communicate with the outside. The extending part 87*b* then allows the cleaning liquid C to flow therethrough to be able to clean the space S1 so as not to allow possible contaminants to the HDD 10 as the flux to remain in the space S1. Further, the space S1 communicates with the outside through two or more paths, therefore, the cleaning liquid C can smoothly flow therein without stagnation. In addition, the extending part 87b is spaced from the conductive layer 76 not to expose the conductive layer 76. As a result, according to the HDD 10 of this embodiment the conductive layer 76 can be prevented from being corroded.

The sensor 67 is an LGA. That means that the space S1 is so small that it is difficult for the cleaning liquid C to flow therein. In the HDD 10 of this embodiment, however, the space S1 is in communication with the outside through the through holes 95 and 101. Thereby, the cleaning liquid C can clean the space S1 so as not to allow possible contaminants to the HDD 10 as the flux to remain in the space S1.

The FPC 18 has the mounting surface 71 and the pad 81 on the mounting surface 71. The sensor 67 includes the package 121 and the land 122 included in the package 121 and electrically connected to the pad 81 through the solder 125. The mounting surface 71 includes the surface region 91 and the recessed region 92 recessed from the surface region 91 provided with the pad 81. In the direction along the surface region 91, the edge (second edge 77e) of the surface region 91 connected to the recessed region 92 is apart from the package 121. This creates the gap G1 between the second edge 77e and the package 121, in communication with the space S1 between the mounting surface 71 and the package 121. The gap G1 allows the cleaning liquid C to flow therethrough to be able to clean the space S1 so as not to allow possible contaminants to the HDD 10 as the flux to remain in the space S1. The HDD 10 of this embodiment can be kept away from contaminants and thus avoided from having a failure such as a head crash, which may otherwise be caused by contaminants.

The FPC 18 includes the base layer 75 on which the pad 81 is placed, and the cover layer 77 covering the base layer 75. The cover layer 77 includes the surface region 91. The cover layer 77 is provided with the exposure hole 87 that is open to the surface region 91 through the cover layer 77, to expose the base layer 75 and the pad 81. The recessed region 92 includes the inner surface 77c of the exposure hole 87. In the direction along the surface region 91, the edge (second edge 77e) of the surface region 91 connected to the inner surface 77c is apart from the package 121. That is, the gap G1 between the second edge 77e and the package 121 is formed by forming the exposure hole 87 in the cover layer 77. Thus, according to the HDD 10 of this embodiment, it is easier to form the gap G1 through which the cleaning liquid C can flow.

Second Embodiment

Hereinafter, a second embodiment is described with reference to FIG. 7. In the following description of the embodiment, constituent elements having functions similar to those of the constituent elements already described are denoted by the same reference numerals as those of the constituent elements already described, and the description thereof may be omitted. Further, the plurality of constituent elements denoted by the same reference numerals do not necessarily have all the functions and properties in common, and may have different functions and properties according to the embodiments.

Figure 7:
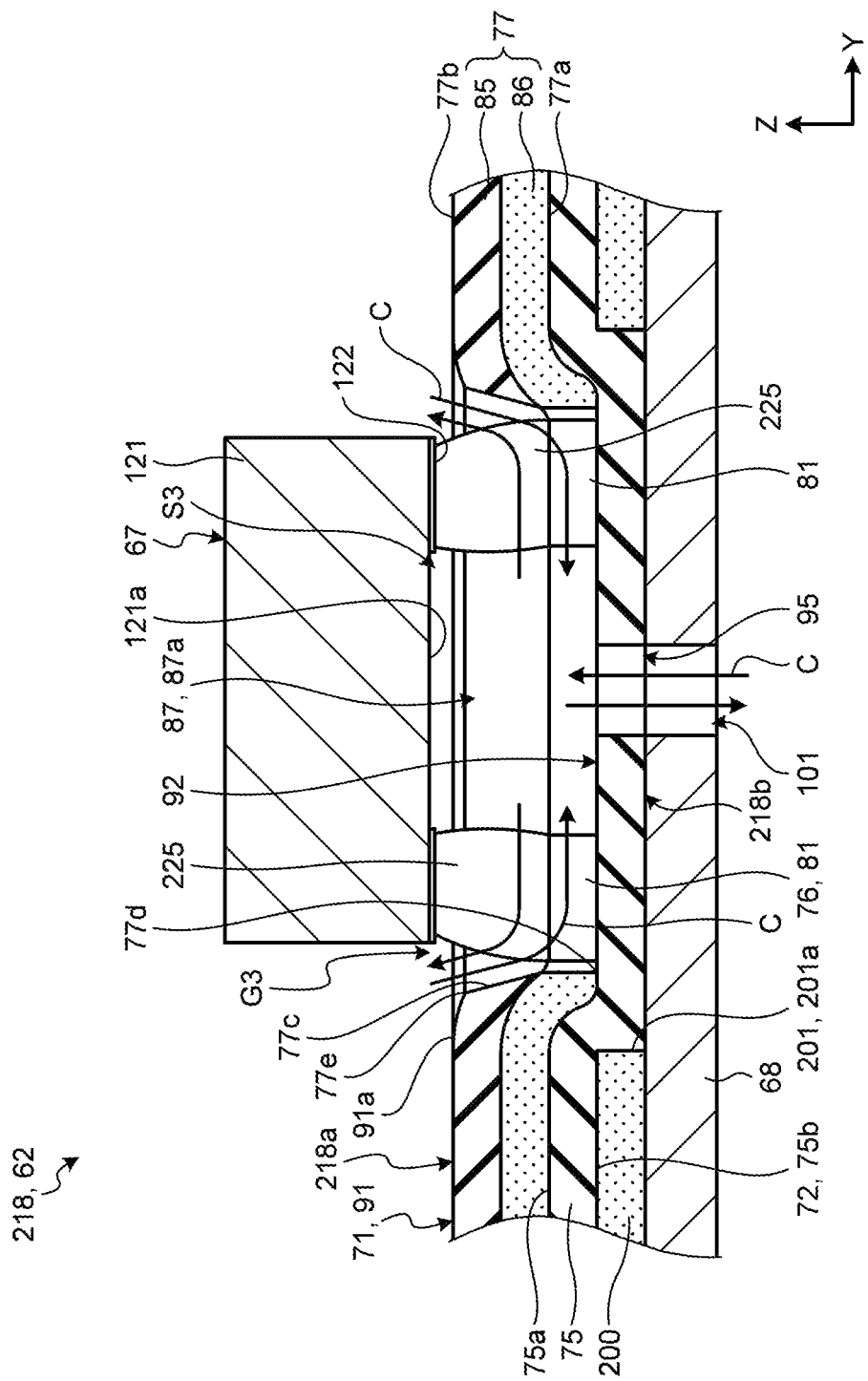
FIG. 7 is an exemplary cross-sectional view illustrating a part of the second connection part in the vicinity of a sensor according to a second embodiment.

FIG. 7 is an exemplary cross-sectional view illustrating a part of the second connection part 62 in the vicinity of the sensor 67 according to the second embodiment. As illustrated in FIG. 7, the HDD 10 of the second embodiment includes an adhesive layer 200 instead of the adhesive layer 110. The adhesive layer 200 is the same as the adhesive layer 110 of the first embodiment except for the points described below.

The adhesive layer 200 has a through hole 201 instead of the through hole 111. The through hole 201 is an example of a fourth through hole and the through hole. The through hole 201 penetrates the adhesive layer 200 in the substantially Z-direction.

In the direction along the upper surface 75a (X-Y plane), the through hole 201 is larger than the package 121 and larger than the exposure part 87a of the exposure hole 87. In the direction along the upper surface 75a, the package 121 and the exposure part 87a of the exposure hole 87 are located inside the edge 201a of the through hole 201.

In the direction along the upper surface 75a, the edge 201a of the through hole 201 is spaced from the package 121, and is spaced from the exposure part 87a of the exposure hole 87. Note that the size of the through hole 201 is not limited to the example.

The HDD 10 of the second embodiment includes an FPC 218 instead of the FPC 18. The FPC 218 is the same as the FPC 18 of the first embodiment except for the points described below. The FPC 218 includes a first part 218a and a second part 218b.

The first part 218a is a part of the FPC 218 that is adhered to the reinforcing plate 68 by the adhesive layer 200. The second part 218b is a part of the FPC 218 overlapping the through hole 201 in the Z-direction. Each of the first part 218a and the second part 218b includes the base layer 75, the conductive layer 76, and the cover layer 77.

The first part 218a spreads substantially flat along the reinforcing plate 68. The first part 218a has the surface region 91 of the mounting surface 71. The surface region 91 has the upper surface 77b of the cover layer 77. The first part 218a may have irregularities or may be bent.

The second part 218b is bent to contact the reinforcing plate 68 through the through hole 201. Therefore, the lower surface 75b of the base layer 75 of the second part 218b comes into contact with the reinforcing plate 68. The second part 218b is recessed from the upper surface 77b of the cover layer 77 of the first part 218a. Thus, the second part 218b has the recessed region 92 of the mounting surface 71.

In the second part 218b, the exposure hole 87 is provided in the cover layer 77. The recessed region 92 of the second part 218b has the upper surface 75a of the base layer 75 facing the package 121, and the pad 131 is provided on the upper surface 75a. In addition, the through hole 95 that is open to the upper surface 75a is provided in the second part 218b.

The through hole 95 directly communicates with the through hole 101 of the reinforcing plate 68. Therefore, a space S3 provided between the upper surface 75a and the package 121 of the second embodiment communicates with the outside of the FPC 218 through the through holes 95 and 101. Note that the through hole 95 may communicate with the through hole 101 through another hole or space.

In the second part 218b, all of the base layer 75, the conductive layer 76, and the cover layer 77 are bent so as to be recessed from the first part 218a. Thus, the recessed region 92 of the second embodiment includes not only the upper surface 75a of the base layer 75 and the inner surface 77c of the cover layer 77 but also the upper surface 77b of the cover layer 77.

In the second embodiment, the edge 91a of the surface region 91 connected to the recessed region 92 is provided on the upper surface 77b of the cover layer 77. In the direction along the surface region 91 (X-Y plane), the edge 91a of the surface region 91 connected to the recessed region 92 is spaced from the package 121.

In the second embodiment, the land 122 is electrically connected to the pad 81 of the FPC 218 through solder 225 instead of the solder 125. In the −Z direction, the length (height) of the solder 225 of the second embodiment is longer than the length (height) of the solder 125 of the first embodiment.

The solder 225 is supplied to the pad 81 by, for example, printing using a metal mask. The metal mask is generally formed substantially flat. Therefore, when placed on the first part 218a of the FPC 218, the metal mask is spaced from the recessed second part 218b. Therefore, a hole of the metal mask is substantially extended according to the depth of the recess of the second part 218b.

The amount of the solder 225 supplied to the hole of the metal mask increases according to the depth of the recess of the second part 218b. The height of the solder 225 thus exceeds the height of the solder 125 of the first embodiment. Note that the solder 225 is not limited to the example.

Since the height of the solder 225 is increased, the distance between the upper surface 75a of the base layer 75 and the package 121 of the second embodiment is longer than the distance therebetween in the first embodiment. Therefore, the space S3 provided between the upper surface 75a and the package 121 is larger than the space S1 of the first embodiment.

When the FPC 218 of the second embodiment is cleaned, the cleaning liquid C flows into the space S3 through the through holes 95 and 101. Further, the cleaning liquid C can be discharged from the space S3 to the outside of the FPC 218 through the through holes 95 and 101.

The cleaning liquid C flows into the space S3 through the gap G3 between the edge 91a of the surface region 91 connected to the recessed region 92 and the package 121. Further, the cleaning liquid C can be discharged from the space S3 to the outside of the FPC 218 through the gap G3.

In the HDD 10 of the second embodiment described above, the adhesive layer 200 adheres the FPC 218 and the reinforcing plate 68 to each other. The adhesive layer 200 is provided with the exposure hole 201 penetrating the adhesive layer 200. The FPC 218 includes the first part 218a adhered to the reinforcing plate 68 by the adhesive layer 200, and the second part 218b bent to contact the reinforcing plate 68 through the through hole 201. That is, the second part 218b is bent to be recessed from the first part 218a. The second part 218b has the upper surface 75a, with the through hole 95, on which the pad 81 is placed. The solder 225 that connects the pad 81 and the land 122 is formed by, for example, printing using a metal mask. The metal mask is placed on the not-recessed first part 218a of the FPC 218. Because of this, a larger amount of the solder 225 is printed on the pad 81 in the recessed second part 218b than in the not-recessed second part 218b. A large amount of the solder 225 between the pad 81 and the land 122 increases the space S3 between the upper surface 75a and the package 121 in size or height. According to the HDD 10 of this embodiment, it is easier to laterally flow the cleaning liquid C into the space S3 between the upper surface 75a and the package 121, to be able to prevent possible contaminants to the HDD 10 as the flux from remaining in the space S3. Further, the space S3 is in communication with the outside through two or more paths, therefore, the cleaning liquid C can smoothly flow therein without stagnation.

The reinforcing plate 68 has rigidity higher than the FPC 218 and is attached to the FPC 218. The adhesive layer 200 adheres the FPC 218 and the reinforcing plate 68 to each other. The adhesive layer 200 is provided with the exposure hole 201 penetrating the adhesive layer 200. The FPC 218 includes the first part 218a adhered to the reinforcing plate 68 by the adhesive layer 200 and the second part 218b bent to contact the reinforcing plate 68 through the through hole 201. The first part 218a includes the surface region 91. The second part 218b includes the recessed region 92. That is, the gap G3 between the edge 91a of the surface region 91 connected to the recessed region 92 and the package 121 is formed by forming the through hole 201 in the adhesive layer 200 and forming the bent second part 218b in the FPC 218. Thus, in the HDD 10 of this embodiment, the gap G3 between the edge 91a of the surface region 91 connected to the recessed region 92 and the package 121 can be easily formed.

Third Embodiment

Figure 8:
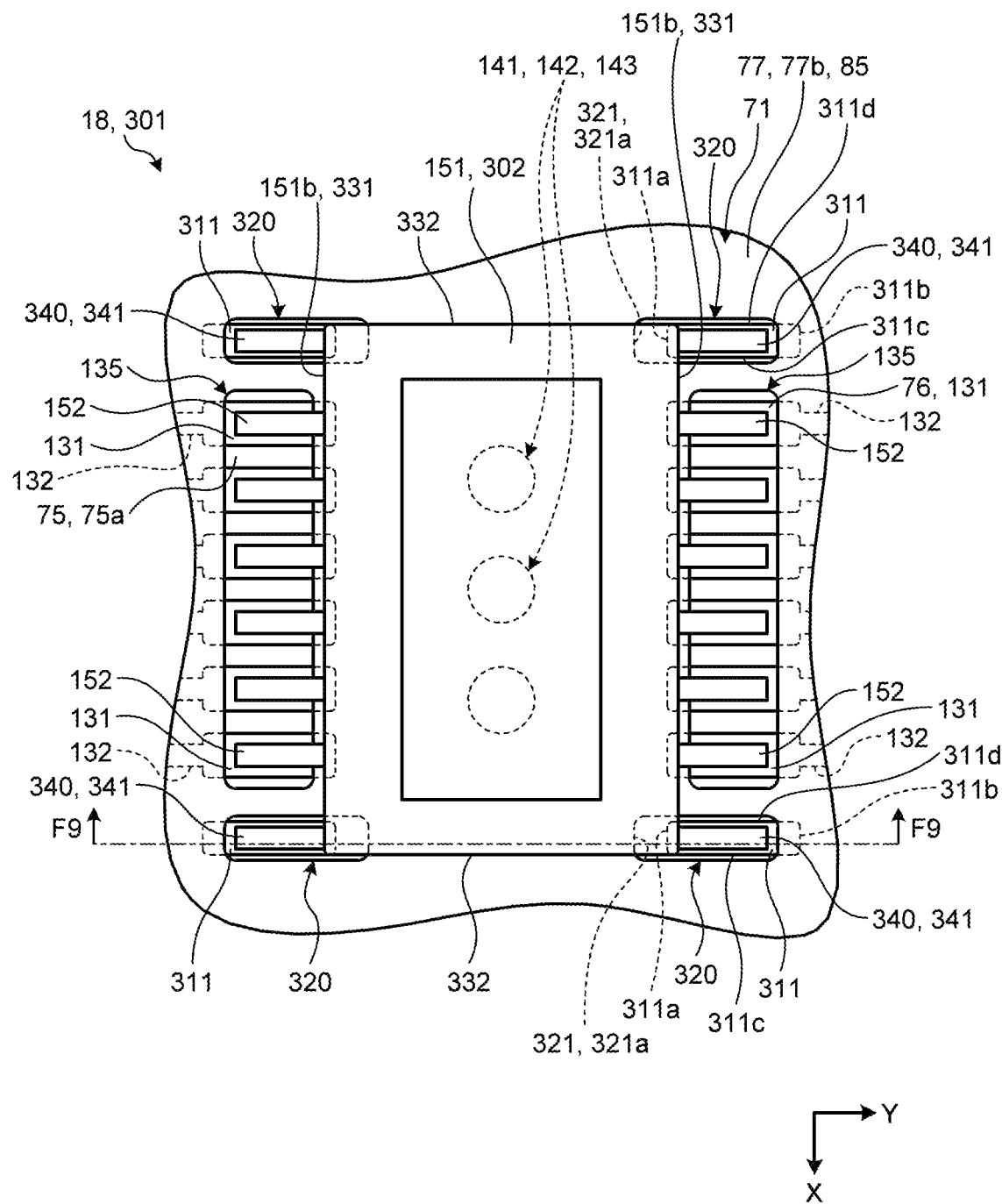
FIG. 8 is an exemplary plan view illustrating a part of a second connection part in the vicinity of a relay connector according to a third embodiment.
Figure 9:
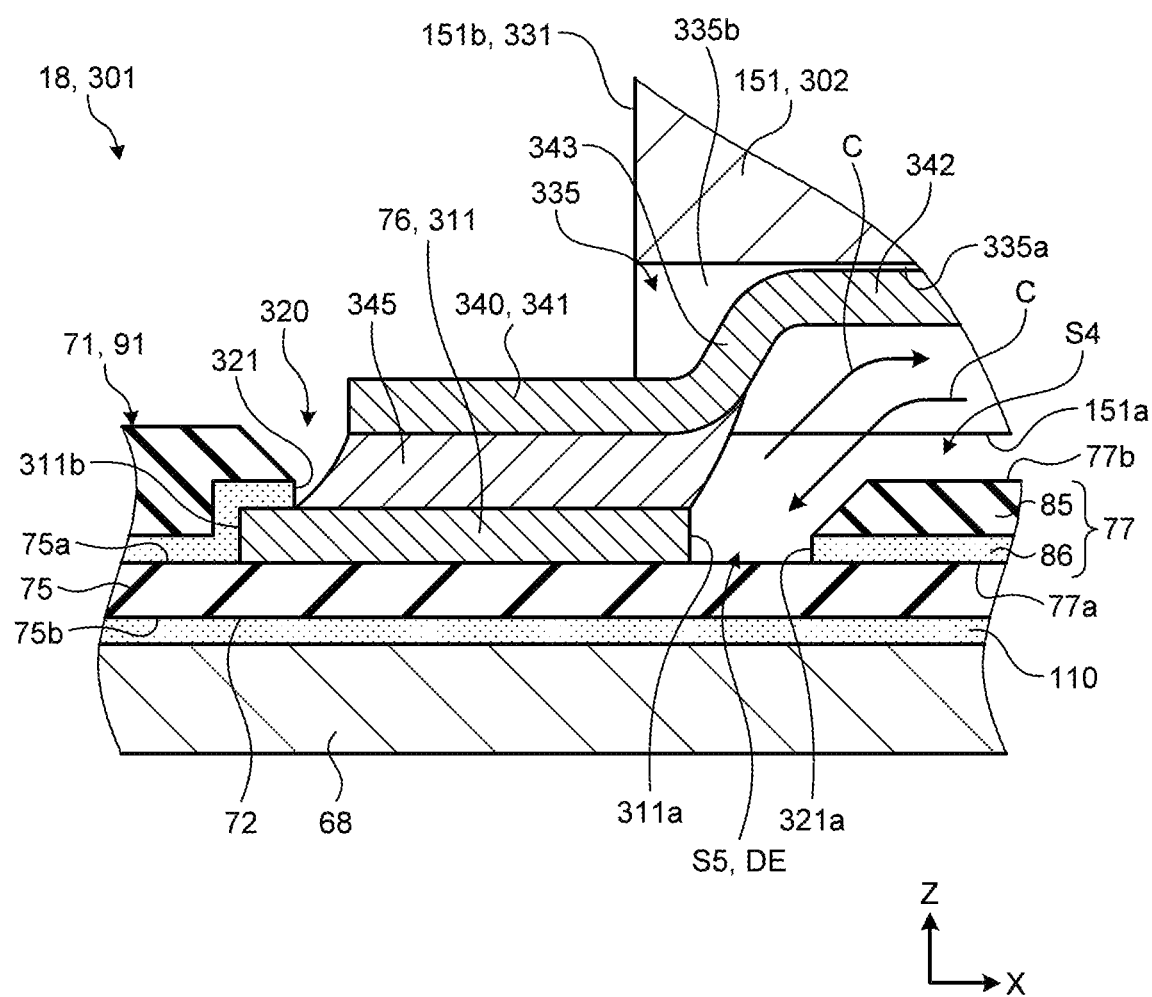
FIG. 9 is an exemplary cross-sectional view illustrating a part of the second connection part of the third embodiment taken along the line F9-F9 of FIG. 8.

Hereinafter, a third embodiment is described with reference to FIGS. 8 to 10. FIG. 8 is an exemplary plan view illustrating a part of a second connection part 301 in the vicinity of a relay connector 302 according to the third embodiment. FIG. 9 is an exemplary cross-sectional view illustrating a part of the second connection part 301 of the third embodiment taken along the line F9-F9 of FIG. 8.

As illustrated in FIG. 8, the HDD 10 of the third embodiment includes the second connection part 301 and the relay connector 302 instead of the second connection part 62 and the relay connector 66. Except for the points described below, the second connection part 301 is the same as the second connection part 62 and the relay connector 302 is the same as the relay connector 66.

The FPC 18 further includes a plurality of pads 311 in the second connection part 301. The pads 311 and the pads 13 are arranged in two rows in the X-direction. Both ends of the rows including the pads 131 and 311 are the pads 311. Note that the pads 311 are not limited to this example.

The pads 311 are included in the conductive layer 76. The pads 311 are thus located on the upper surface 75a of the base layer 75. The upper surface 75a is an example of a surface of the first layer. The pads 311 may be electrically connected to other pads, an electronic component or components, or a ground in a wireless or wired manner.

The pads 131 and 311 have a substantially rectangular shape extending in the Y-direction. Thus, the pads 311 are longer in length in the Y-direction than in the X-direction. Note that the shape of the pads 131 and 311 is not limited to the example.

Each of the pads 311 has four edges 311a, 311b, 311c, and 311d. The edge 311a is an example of a first end and an end of the pad in a first direction. The edge 311b is an example of a second end and an end of the pad in a second direction.

The edge 311a is an end of the pad 311 in a direction toward the center of the relay connector 302 (hereinafter, referred to as an inward direction) in the Y-direction. The inward direction is a direction along the upper surface 75a and is an example of the first direction. As for the pad 311 illustrated in FIG. 9, +Y-direction corresponds to the inward direction.

The edge 311b is an end of the pad 311 in a direction opposite to the inward direction (hereinafter, referred to as an outward direction). The outward direction is a direction along the upper surface 75a and is an example of the second direction. As for the pad 311 illustrated in FIG. 9, −Y-direction corresponds to the outward direction. As illustrated in FIG. 8, the edges 311a and 311b extend substantially in the X-direction.

The edge 311c is an end of the pad 311 in the +X-direction. The edge 311d is an end of the pad 311 in the −X-direction. The edges 311c and 311d extend substantially in the Y-direction between the edge 311a and the edge 311b.

In the second connection part 301, the cover layer 77 is provided with a plurality of exposure holes 320. The exposure hole 320 is an example of the exposure hole and a fifth through hole. As illustrated in FIG. 9, the exposure hole 320 penetrates the cover layer 77 substantially in the Z-direction and is open to the lower surface 77a and the upper surface 77b.

The number of exposure holes 320 is equal to the number of pads 311. The exposure holes 320 partially expose the upper surface 75a of the base layer 75 and the corresponding pads 311. Note that the exposure holes 320 are not limited to this example.

The cover layer 77 further has an inner surface 321 that is the inner surface of the exposure hole 320. The inner surface 321 extends between the lower surface 77a and the upper surface 77b of the cover layer 77. Since the lower surface 77a is adhered to the upper surface 75a of the base layer 75, the inner surface 321 extends between the upper surface 75a of the base layer 75 and the upper surface 77b of the cover layer 77.

The exposure hole 320 does not cover but exposes the edge 311a, a part of the edge 311c, and a part of the edge 311d of the pad 311. In other words, the inner surface 321 of the exposure hole 320 is apart from the edge 311a.

The cover layer 77 covers the edge 311b, the other part of the edge 311c, and the other part of the edge 311d of the pad 311. Alternatively, the edges 311b, 311c, and 311d may be exposed by the exposure hole 320, for example.

As illustrated in FIG. 8, the side surface 151b of the case 151 includes two side surfaces 331 and two side surfaces 332. The two side surfaces 331 are both ends of the case 151 in the Y-direction. The lead wires 152 are laid on the side surface 331. The two side surfaces 332 are both ends of the case 151 in the X-direction.

Figure 10:
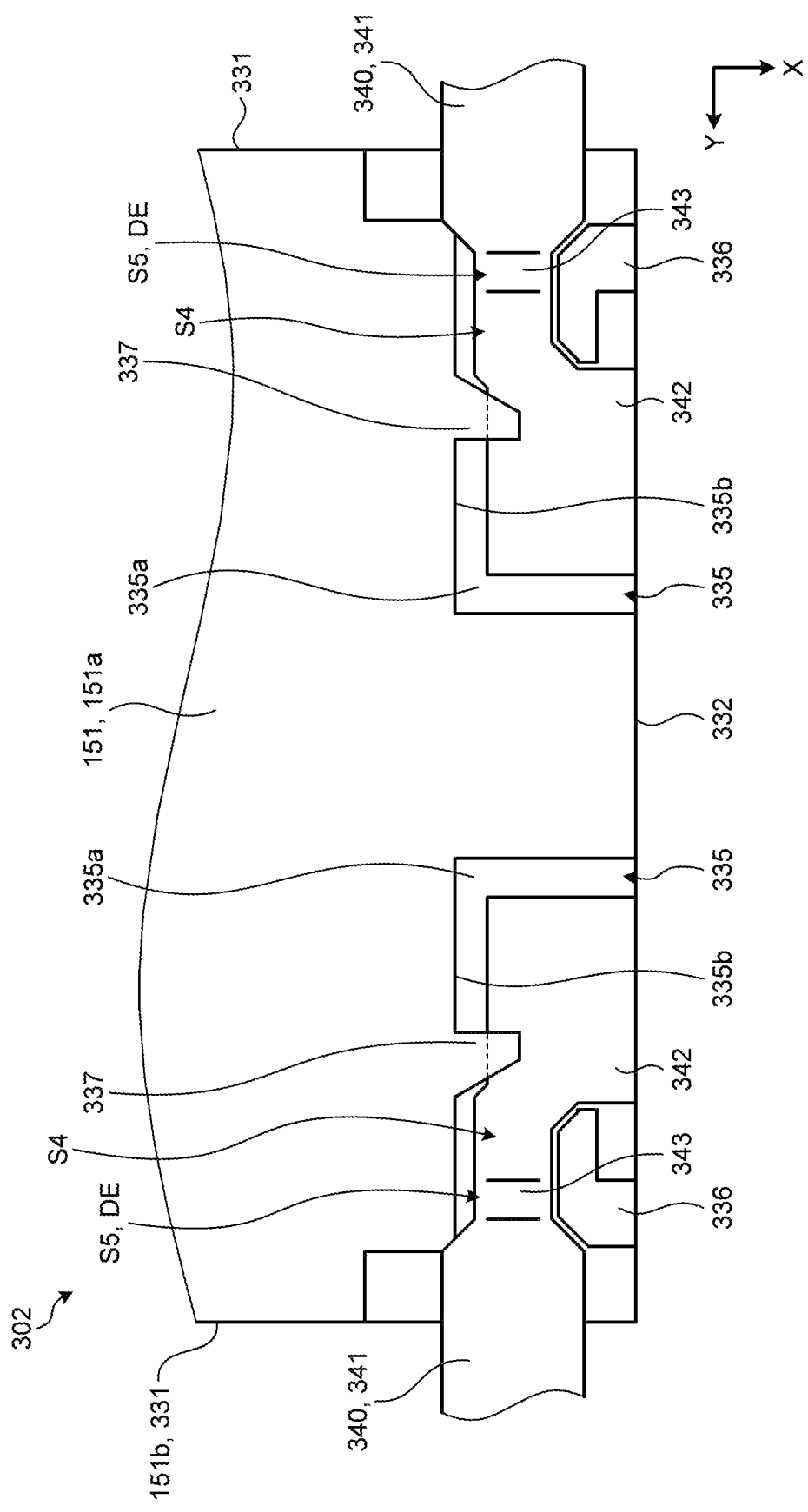
FIG. 10 is an exemplary bottom view illustrating the relay connector of the third embodiment.

FIG. 10 is an exemplary bottom view illustrating the relay connector 302 of the third embodiment. As illustrated in FIG. 10, the case 151 is provided with a plurality of cutouts 335. The cutouts 335 are open to the two corresponding side surfaces 332, the two corresponding side surfaces 331, and the lower surface 151a.

The case 151 further has bottom surfaces 335a and inner surfaces 335b of the cutouts 335. The bottom surfaces 335a face a substantially −Z-direction. The inner surfaces 335b face a direction intersecting the direction that the bottom surfaces 335a face.

The case 151 further includes a plurality of holding protrusions 336 and 337. The holding protrusions 336 are located apart from the inner surface 335b and protrude from the bottom surface 335a in the substantially −Z-direction. The holding protrusion 337 are located apart from the bottom surface 335a in the −Z-direction and protrude from the inner surface 335b.

As illustrated in FIG. 8, the relay connector 302 further includes a plurality of lead wires 340. The lead wires 340 are an example of a metal member. The lead wires 152 and 340 of the relay connector 302 are made of metal.

The lead wires 152 electrically connect the pads 131 to the connector placed on the bottom wall 25 or the relay connector 53 of the PCB 19. The lead wires 340 may electrically connect the pads 311 to other components. Alternatively, the lead wires 340 may be reinforcing pins electrically unconnected to components to which the relay connector 302 is connected.

As illustrated in FIG. 10, the lead wires 340 are attached to the case 151 by fitting into the cutouts 335 of the case 151. Alternatively, the lead wires 340 may be partially embedded in the case 151. Part of the lead wires 340 protrudes from the side surfaces 331 of the case 151. In other words, the side surfaces 331 are provided with the lead wires 340 extending on the side surfaces 331. Each of the lead wires 340 includes a bonded part 341, a non-contact part 342, and an intermediate part 343. The bonded part 341, the non-contact part 342, and the intermediate part 343 are integrated.

As illustrated in FIG. 9, the bonded part 341 extends in the substantially Y-direction. At least a part of the bonded part 341 is located outside the cutout 335. The bonded part 341 is bonded to the pad 311 of the FPC 18 through solder 345.

The non-contact part 342 is accommodated in the cutout 335 and is attached to the case 151. The non-contact part 342 is thus located between the bonded part 341 and the case 151. Alternatively, the non-contact part 342 may be located outside the cutout 335.

In a direction along the upper surface 75a, the non-contact part 342 is inwardly apart from the bonded part 341. Further, the non-contact part 342 is farther away from the upper surface 75a than the bonded part 341 in the Z-direction. The Z-direction is a direction orthogonal to the upper surface 75a.

The intermediate part 343 connects between the bonded part 341 and the non-contact part 342. The intermediate part 343 extends diagonally with respect to the upper surface 75a between the inner end of the bonded part 341 and the outer end of the non-contact part 342. The intermediate part 343 extends farther away from the upper surface 75a as is toward the non-contact part 342 from the bonded part 341.

The inner surface 321 of the exposure hole 320 is apart from the inner end of the intermediate part 343. For example, the inner surface 321 has an edge 321a. The edge 321a is, for example, of the inner end of the inner surface 321 and extends substantially in the X-direction. The edge 321a of the inner surface 321 and the edge 311a of the pad 311 face each other.

The edge 321a of the inner surface 321 is inwardly apart from the edge 311a of the pad 311. Further, in the Y-direction, the edge 321a is inwardly apart from the intermediate part 343. The non-contact part 342 covers at least a part of the edge 321a. In other words, in the Y-direction, the edge 321a is located between both ends of the non-contact part 342. The intermediate part 343 may cover a part of the edge 321a. The case 151 covers at least a part of the edge 321a of the inner surface 321. Thus, at least a part of the edge 321a is located between the upper surface 75a and the case 151.

As illustrated in FIG. 10, a part of the bonded part 341, a part of the non-contact part 342, and the intermediate part 343 are located between the inner surface 335b of the cutout 335 and the holding protrusion 336. Further, the non-contact part 342 is located between the bottom surface 335a of the cutout 335 and the holding protrusion 337. This arrangement allows the holding protrusions 336 and 337 to hold the lead wire 340.

As illustrated in FIG. 9, there is a space S4 between the non-contact part 342 and the upper surface 77b of the cover layer 77. The space S4 is a part of the cutout 335 and is open to the side surface 332 of the case 151. Further, a space S5 lies between the non-contact part 342 and the intermediate part 343, and upper surface 75a of the base layer 75 exposed by the exposure hole 320.

The space S4 is in communication with the spaces S2 and S5. The space S5 is thus in communication with the space S2 and the through holes 141, 142, and 143 via the space S4. Further, the space S5 is in communication with the side surface 332 of the case 151 via the space S4.

Hereinafter, an exemplary mounting method of the relay connector 302 on the FPC 18 is partly described. The mounting method of the relay connector 302 on the FPC 18 is not limited to the following method, and other methods may be used. First, solder paste (solder 155 and 345) is applied to the pads 131 and 311 by, for example, printing or coating.

Next, the relay connector 302 is mounted on the pads 131 and 311. The FPC 18 is then heated in a reflow furnace to melt the solder paste. Thereby, the lead wires 152 and 340 of the relay connector 302 are bonded to the pads 131 and 311. Flux is mixed with or separately supplied to the solder 155 and 345. At the time of bonding the lead wires 152 and 340, the flux may flow out of the solder 155 and 345.

Next, the FPC 18 is subjected to cleaning, such as ultrasonic cleaning. For example, the FPC 18 is placed in a tank filled with cleaning liquid C. The cleaning liquid C flows into the space S5 through the through holes 141, 142, and 143, the space S2, and the space S4. Alternatively, the cleaning liquid C may flow into the space S5 through the space S4 that is open to the side surface 332. The cleaning liquid C can be discharged from the space S5 to the outside of the FPC 18 through the space S4.

The cleaning liquid C flows into the spaces S4 and S5 and is discharged from the spaces S4 and S5. That is, the cleaning liquid C flows through the spaces S4 and S5. As a result, the cleaning liquid C can remove possible contaminants to the HDD 10 present in the spaces S4 and S5.

As illustrated in FIG. 10, between the FPC 18 and the relay connector 302 is a dead end DE. The dead end DE includes the space S5 and a part of the space S4. The dead end DE is surrounded by the FPC 18, the inner surface 335b of the cutout 335, the holding protrusion 336, the holding protrusion 337, the bonded part 341, the non-contact part 342, and the intermediate part 343, and is open only in the substantially inward direction. For this reason, it may be difficult for the cleaning liquid C to flow into and out of the dead end DE.

In this embodiment, the inner surface 321 of the exposure hole 320 is apart from the edge 311a of the pad 311. Thus, the exposure hole 320 can be larger in size at the dead end DE, exposing a larger region of the upper surface 75a of the base layer 75.

The exposure hole 320 being larger in size at the dead end DE increases the dimension of the dead end DE in the Z-direction. Specifically, distances between the non-contact part 342 and the intermediate part 343, and the FPC 18 are increased. This allows the cleaning liquid C to easily flow into and out of the dead end DE.

After completion of the ultrasonic cleaning, the FPC 18 is extracted from the cleaning liquid C. The cleaning liquid C and the flux are also discharged from the space S5 through the space S4. This completes the mounting of the relay connector 302 on the FPC 18.

In the HDD 10 of the third embodiment described above, the FPC 18 includes the base layer 75 having the upper surface 75a, the cover layer 77 covering the upper surface 75a, and the pad 311 placed on the upper surface 75a. The relay connector 302 includes the case 151 which is provided with the lead wire 340. The cover layer 77 is provided with the exposure hole 320 penetrating the cover layer 77 to expose the upper surface 75a and the pad 311. The cover layer 77 has the upper surface 77b to which the exposure hole 320 is open, and the inner surface 321 of the exposure hole 320 extending between the upper surface 75a and the upper surface 77b. The lead wire 340 includes the bonded part 341 and the non-contact part 342. The bonded part 341 is bonded to the pad 311 through the solder 345. The non-contact part 342 is located between the bonded part 341 and the case 151. In a direction along the upper surface 75a, the non-contact part 342 is apart from the bonded part 341 in the inward direction, the inward direction being a direction along the upper surface 75a. In the Z-direction orthogonal to the upper surface 75a, the non-contact part 342 is farther away from the upper surface 75a than the bonded part 341. The inner surface 321 is apart from the edge 311a of the pad 311, the edge 311a being an end of the pad 311 in the inward direction. That is, the upper surface 75a is not covered with the cover layer 77 between the inner edge 311a of the pad 311 and the inner surface 321 but exposed. This can form the space S5, through which the cleaning liquid C can flow, between the inner edge 311a of the pad 311 and the inner surface 321 and between the non-contact part 342 and the upper surface 75a. In other words, between the non-contact part 342 and the FPC 18 the spaces S4 and S5 of a larger size are formed, enabling the cleaning liquid C to easily flow therethrough. As such, the HDD 10 of this embodiment can avoid possible contaminants to the HDD 10 as the flux from remaining in the spaces S4 and S5. As a result, the HDD 10 can be prevented from having a failure such as a head crash, which would otherwise occur due to the contaminants.

The lead wire 340 includes the intermediate part 343 between the bonded part 341 and the non-contact part 342. The intermediate part extends diagonally with respect to the upper surface 75a. The inner surface 321 is apart from the inner end of the intermediate part 343. This forms the larger spaces S4 and S5 between the intermediate part 343 and the FPC 18, which allows the cleaning liquid C to easily flow through the spaces S4 and S5. Thus, the HDD 10 of this embodiment can avoid possible contaminants to the HDD 10 from remaining in the spaces S4 and S5. Consequently, the HDD 10 can be avoided from having a failure such as a head crash, which may otherwise occur due to the contaminants.

In the inward direction at least a part of the edge 321a of the inner surface 321 is located between the upper surface 75a and the case 151. In other words, in the inward direction at least a part of the edge 321a of the exposure hole 320 is covered by the case 151. That is, the inward direction is a direction from the bonded part 341 to the inside of the relay connector 302 in the direction along the upper surface 75a. The spaces S4 and S5 between the non-contact part 342 and the FPC 18 are in-between the case 151 and the FPC 18. The HDD 10 of this embodiment allows the formation of the spaces S4 and S5 of a larger size between the case 151 and the FPC 18, leading to avoiding possible contaminants to the HDD 10 from remaining in the spaces S4 and S5.

The edge 311b of the pad 311 is covered with the cover layer 77, the edge 311b being an end of the pad 311 in the outward direction opposite to the inward direction. This prevents the solder from attaching to the wiring connected to the edge 311b of the pad 311 in the outward direction, for example.

In the above description, the word "prevent" is defined as, for example, preventing the occurrence of an event, an action, or an influence, or reducing the degree of the event, the action, or the influence.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A disk device comprising:
a magnetic disk;
a magnetic head configured to read and write information from and to the magnetic disk;
a flexible printed circuit board electrically connected to the magnetic head;
an electronic component mounted on the flexible printed circuit board; and
a first plate having rigidity higher than the flexible printed circuit board and attached to the flexible printed circuit board, wherein
the flexible printed circuit board with a first through hole comprises
a first surface facing the electronic component with a space, and
a second surface opposite the first surface and facing the first plate, the first through hole being open to the first surface and the second surface to communicate with the space, and
the first plate is provided with a second through hole penetrating the first plate, wherein
the flexible printed circuit board comprises a first layer having the first surface, a second layer covering the first surface, and a first pad on the first surface,
the electronic component comprises a case and a wiring comprised in the case, and
the second layer is provided with a hole exposing the first surface and the first pad and an inner surface of the hole, and
the wiring comprises a bonded part bonded to the first pad through a solder, and a first lead located between the bonded part and the case.

2. The disk device according to claim 1, wherein
in a direction along the first surface, the first lead is apart from the bonded part in a first direction, the first direction being a direction along the first surface,
in a direction orthogonal to the first surface, the first lead is farther away from the first surface, and
the inner surface is apart from a first end of the first pad, the first end being an end of the first pad in the first direction.

3. The disk device according to claim 2, wherein
the wiring comprises an intermediate part between the bonded part and the first lead, the intermediate part extending diagonally with respect to the first surface, and
the inner surface is apart from an end of the intermediate part, the end of the intermediate part being an end of the intermediate part in the first direction.

4. The disk device according to claim 2, wherein
at least a part of an end of the inner surface is located between the first surface and the case, the end of the inner surface being an end of the inner surface in the first direction.

5. The disk device according to claim 2, wherein
a second end of the first pad is covered with the second layer, the second end being an end of the first pad in a second direction opposite to the first direction.

6. A disk device comprising:
a magnetic disk;
a magnetic head configured to read and write information from and to the magnetic disk;
a flexible printed circuit board with an exposure hole, electrically connected to the magnetic head, the flexible printed circuit board including a first layer, a first pad on a surface of the first layer, and a second layer covering the surface, the exposure hole penetrating the second layer to expose the surface and the first pad; and
an electronic component mounted on the flexible printed circuit board and including a case which is provided with a wiring, wherein
the wiring comprises a bonded part bonded to the first pad through a solder, and a first lead located between the bonded part and the case,
in a direction along the surface, the first lead is apart from the bonded part in a first direction, the first direction being a direction along the surface,
in a direction orthogonal to the surface, the first lead is farther away from the surface than the bonded part, and
an inner surface of the exposure hole is apart from a first end of the first pad, the first end being an end of the first pad in the first direction.

7. The disk device according to claim 6, wherein
the wiring comprises an intermediate part between the bonded part and the first lead, the intermediate part extending diagonally with respect to the surface, and
the inner surface is apart from an end of the intermediate part, the end of the intermediate part being an end of the intermediate part in the first direction.

8. The disk device according to claim 6, wherein
at least a part of an end of the inner surface is located between the surface and the case, the end of the inner surface being an end of the inner surface in the first direction.

9. The disk device according to claim 6, wherein
a second end of the first pad is covered with the second layer, the second end being an end of the first pad in a second direction opposite to the first direction.

10. A disk device comprising:
a magnetic disk;
a magnetic head configured to read and write information from and to the magnetic disk;
a flexible printed circuit board comprising a first pad, the flexible printed circuit board being electrically connected to the magnetic head;
an electronic component mounted on the flexible printed circuit board; and
a first plate having rigidity higher than the flexible printed circuit board and attached to the flexible printed circuit board, wherein
the electronic component comprises a case and a wiring comprised in the case, the wiring bonded to the first pad through a solder,
the flexible printed circuit board with a first through hole comprises a first surface facing the electronic component with a space, the space that lies between the first surface and the case, a second surface opposite the first surface and facing the first plate, a first layer having the first surface, and a second layer covering the first surface and located apart from the case, the first through hole being open to the first surface and the second surface to communicate with the space, and the first plate is provided with a second through hole penetrating the first plate to communicate with the first through hole.

11. The disk device according to claim 10, wherein the second layer comprises a third surface surrounding the electronic component.

12. The disk device according to claim 11, wherein the second layer is provided with a third through hole that penetrates the second layer and exposes the first surface and the first through hole, the third through hole is open to the third surface, and the second layer comprises an inner surface of the third through hole extending between the first surface and the third surface.

13. The disk device according to claim 12, wherein in a direction along the first surface, an edge of the third surface connected to the inner surface is apart from the case.

14. The disk device according to claim 12, wherein the inner surface has a first edge connected to the first surface and a second edge connected to the third surface, the second edge being larger than the first edge, and at least a part of the inner surface extends diagonally with respect to the first surface between the first edge and the second edge.

15. The disk device according to claim 10, wherein the flexible printed circuit board comprises a third layer having a conductive property and located between the first layer and the second layer, the third layer comprising a second pad, the second layer is provided with a third through hole penetrating the second layer, the third through hole comprising:

an exposure part that exposes the first surface, the first through hole, and the second pad, and an extending part that is apart from the third layer, extends from the exposure part, and exposes the first surface, and in a direction along the first surface, at least a part of the extending part is apart from the case.

16. The disk device according to claim 10, wherein the flexible printed circuit board comprises a mounting surface and a second pad, the mounting surface comprises a first region, and a second region comprising the first surface, recessed from the first region, and on which the second pad is provided, and in a direction along the first region, an edge of the first region connected to the second region is apart from the case.

17. The disk device according to claim 10, wherein the first through hole comprises three through holes, each being open to the first surface and the second surface to communicate with the space, and the three through holes are arranged in a third direction along the first surface.

* * * * *